United States Patent
Ballantyne et al.

(10) Patent No.: US 9,100,026 B2
(45) Date of Patent: Aug. 4, 2015

(54) DEVICES AND METHODS FOR REDUCING NOISE IN DIGITALLY CONTROLLED OSCILLATORS

(71) Applicant: QUALCOMM Incorporated, San Diego, CA (US)

(72) Inventors: Gary John Ballantyne, Christchurch (NZ); Bo Sun, Carlsbad, CA (US); Yi Tang, San Diego, CA (US); Zixiang Yang, San Diego, CA (US); Masoud Ensafdaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 41 days.

(21) Appl. No.: 13/938,727

(22) Filed: Jul. 10, 2013

(65) Prior Publication Data

US 2015/0015343 A1    Jan. 15, 2015

(51) Int. Cl.
*H03L 7/099* (2006.01)
*H03B 5/12* (2006.01)
*H03J 5/24* (2006.01)

(52) U.S. Cl.
CPC ............ *H03L 7/0991* (2013.01); *H03B 5/1265* (2013.01); *H03J 5/24* (2013.01); *H03L 7/099* (2013.01); *H03B 2200/0088* (2013.01); *H03B 2201/025* (2013.01); *H03B 2202/017* (2013.01); *H03J 2200/10* (2013.01); *H03J 2200/36* (2013.01); *H03L 2207/50* (2013.01)

(58) Field of Classification Search
CPC .............. H03B 5/1265; H03B 5/1293; H03B 2200/005; H03B 2200/0088; H03B 2201/025; H03J 5/24; H03J 5/2465; H03J 2200/10; H03J 2200/36; H03L 7/099; H03L 2207/50
USPC ....... 331/117 R, 117 FE, 167, 179, 36 C, 175
See application file for complete search history.

(56) References Cited

U.S. PATENT DOCUMENTS 7,046,098 B2 * 5/2006 Staszewski ................... 331/158
7,518,458 B2    4/2009 Nakamura et al.

(Continued)

FOREIGN PATENT DOCUMENTS

EP    1 351 397 A2    10/2003
EP    1 460 762 A1    9/2004

OTHER PUBLICATIONS

International Search Report and Written Opinion—PCT/US2014/045539—ISA/EPO—Oct. 22, 2014 (9 total pages).

*Primary Examiner* — Ryan Johnson
(74) *Attorney, Agent, or Firm* — Arent Fox LLP

(57) ABSTRACT

One feature pertains to a digitally controlled oscillator (DCO) that comprises a variable capacitor and noise reduction circuitry. The variable capacitor has a variable capacitance value that controls an output frequency of the DCO. The variable capacitance value is based on a first bank capacitance value provided by a first capacitor bank, a second bank capacitance value provided by a second capacitor bank, and an auxiliary bank capacitance value provided by an auxiliary capacitor bank. The noise reduction circuitry is adapted to adjust the variable capacitance value by adjusting the auxiliary bank capacitance value while maintaining at least one of the first bank capacitance value and/or the second bank capacitance value substantially unchanged. Prior to adjusting the variable capacitance value, the noise reduction circuitry may determine that a received input DCO control word transitions across a capacitor bank sensitive boundary.

24 Claims, 13 Drawing Sheets

(56) References Cited

U.S. PATENT DOCUMENTS

| | | |
|---|---|---|
| 7,714,665 B2 | 5/2010 | Waheed et al. |
| 7,973,609 B2 | 7/2011 | Ohara et al. |
| 8,044,741 B2 | 10/2011 | Barton et al. |
| 2010/0052795 A1 | 3/2010 | Nakamura et al. |
| 2011/0234326 A1* | 9/2011 | Kobayashi .................. 331/1 A |

* cited by examiner

| 5-bit Control Word 502 | | Variable Capacitance $C_{Var}$ without Noise Reduction | Variable Capacitance $C_{Var\_NR}$ |
|---|---|---|---|
| MSBs | LSBs | | |
| 01 | 010 | $C_{A1} + C_{B1} + C_{B2}$ | $C_{A1} + C_{B1} + C_{B2}$ |
| 01 | 001 | $C_{A1} + C_{B1}$ | $C_{B1} + C_{B2} + C_{B3} + C_{B4} + C_{B5} + C_{Z1} + C_{Z2} + C_{Z3} + \ldots + C_{Z16}$ |
| 01 | 000 | $C_{A1}$ | $C_{B1} + C_{B2} + C_{B3} + C_{B4} + C_{B5} + C_{Z1} + C_{Z2} + C_{Z3} + \ldots + C_{Z12}$ |
| 00 | 111 | $C_{B1} + C_{B2} + C_{B3} + C_{B4} + C_{B5} + C_{B6} + C_{B7}$ | $C_{B1} + C_{B2} + C_{B3} + C_{B4} + C_{B5} + C_{Z1} + C_{Z2} + C_{Z3} + \ldots + C_{Z8}$ |
| 00 | 110 | $C_{B1} + C_{B2} + C_{B3} + C_{B4} + C_{B5} + C_{B6}$ | $C_{B1} + C_{B2} + C_{B3} + C_{B4} + C_{B5} + C_{Z1} + C_{Z2} + C_{Z3} + C_{Z4}$ |
| 00 | 101 | $C_{B1} + C_{B2} + C_{B3} + C_{B4} + C_{B5}$ | $C_{B1} + C_{B2} + C_{B3} + C_{B4} + C_{B5}$ |

*FIG. 9*

DEVICES AND METHODS FOR REDUCING NOISE IN DIGITALLY CONTROLLED OSCILLATORS

BACKGROUND

1. Field

Various features relate to digital circuits, and in particular to devices and methods for reducing noise in digitally controlled oscillators.

2. Background

An all-digital phase locked loop (PLL) is a digital control system that generates an output signal whose phase is related to the phase of an input "reference" signal. A PLL is an electronic circuit comprising a digitally controlled, variable frequency oscillator (DCO) and a phase detector. The PLL compares the phase of the input signal with the phase of the signal derived from its output DCO and adjusts the frequency of its DCO to keep the phases matched. The signal from the phase detector is used to control the DCO in a feedback loop.

A DCO operates by receiving a digital input signal level (e.g., a multi-bit control word) as an input and generating an output signal having a frequency corresponding to the input signal level. A typical DCO may utilize an LC-tank having a variable capacitor that can be tuned in order to adjust its resonant output frequency. Thus, the input signal level (e.g., control word) in effect controls controls the output frequency of the DCO by adjusting the capacitance value of the variable capacitor.

The variable capacitor used in a typical DCO may include a plurality of capacitor banks where each capacitor bank includes a plurality of individual capacitors. These individual capacitors may be independently enabled so that their capacitance value is contributed to the total capacitance of the DCO's LC tank. As one example, a variable capacitor of a DCO may comprise two distinct capacitor banks A and B that are coupled to each other in parallel. Capacitor bank A includes three distinct capacitors $C_{A1}$, $C_{A2}$, $C_{A3}$ coupled in parallel that each have equal capacitance values. Capacitor bank B includes seven capacitors $C_{B1}$, $C_{B2}$, $C_{B3}$, $C_{B4}$, $C_{B5}$, $C_{B6}$, $C_{B7}$ that are also coupled in parallel and also each have equal capacitance values. The capacitance value of each bank A capacitor $C_A$ is equal to eight times that of the capacitance value $C_B$ of the capacitors in bank B. Thus, $C_A = 8*C_B$.

The DCO receives control words that enable or disable the aforementioned capacitors $C_{A1}$, $C_{A2}$, $C_{A3}$, $C_{B1}$, $C_{B2}$, $C_{B3}$, $C_{B4}$, $C_{B5}$, $C_{B6}$, $C_{B7}$ in order to generate a corresponding output frequency. For example, a binary control word "00111" may enable capacitors $C_{B1}$, $C_{B2}$, $C_{B3}$, $C_{B4}$, $C_{B5}$, $C_{B6}$, $C_{B7}$ for a total capacitance value of $7*C_B$, whereas the control word "01000" may enable capacitor $C_{A1}$ for a total capacitance value of $8*C_B$ (since $C_A = 8*C_B$).

Notably, when the control word transitions from "00111" to "01000" seven capacitors $C_{B1}$, $C_{B2}$, $C_{B3}$, $C_{B4}$, $C_{B5}$, $C_{B6}$, $C_{B7}$ from capacitor bank B are disabled (i.e., decoupled from the LC-tank output) and one large capacitor $C_{A1}$ from capacitor bank A is enabled (i.e., coupled to the LC-tank output). Such points of transition where multiple capacitors are coupled and decoupled at once from multiple banks for the DCO output frequency to increment/decrement one step are herein referred to as "capacitor bank sensitive boundaries," and the control words that are adjacent to such boundaries are referred to as "boundary-sensitive control words."

FIG. 1 illustrates an example of such capacitor bank sensitive boundaries and control words and the effect they have on the total output variable capacitance $C_{Var}$ of a DCO found in the prior art. A table 100 depicts a portion of the plurality of 5-bit control words that may control the output frequency of the DCO. The first two most significant bits (MSBs) of the control word in this example control (i.e., enable/disable) the aforementioned bank A capacitors and the three least significant bits (LSBs) control the bank B capacitors. The table shows four (4) boundary-sensitive control words (the control words having the hatched background) and two (2) capacitor bank sensitive boundaries 102a, 102b that each separate the pairs of boundary-sensitive control words.

In the illustrated example, a DCO input control word signal is undergoing a small oscillation between the two boundary-sensitive control words "00111" and "01000." As a result, the output variable capacitance $C_{Var}$ also oscillates back and forth between $C_{A1}$ and $C_{B1}+C_{B2}+C_{B3}+C_{B4}+C_{B5}+C_{B6}+C_{B7}$. Thus, many capacitors across a plurality of different capacitor banks are being enabled and disabled at the same time as the input control word transitions between the boundary-sensitive control words. Specifically, the example shown one (1) larger capacitor from bank A is enabled (i.e., coupled to the output) and seven (7) smaller capacitors from bank B are disabled (i.e., disconnected from the output).

Coupling and decoupling so many capacitors from different capacitor banks at the output of the DCO injects noise into the DCO output signal. Moreover, inherent mismatches among the different capacitor banks (e.g., capacitor banks A and B) contribute noise and/or frequency inaccuracies to the DCO output signal when switching between capacitor banks at capacitor bank sensitive boundaries. Although individual capacitors within a single capacitor bank may be relatively well matched with one another, capacitors from different banks may not be so well matched. For instance, in the example discussed above it was assumed that each capacitor from bank A has a capacitance value $C_A$ that is equal to eight (8) capacitors $C_B$ from bank B. In practice, however, manufacturing variability may cause $C_{A1}$ to be, for example, greater than $8*C_B$ and capacitors $C_{B1}+C_{B2}+C_{B3}+C_{B4}+C_{B5}+C_{B6}+C_{B7}$ together to be less than $7*C_B$. This deviation from the expected step increment may be expressed as $C_{error}$ as shown in FIG. 1, and may be relatively large due to the greater mismatch between different capacitor banks.

As one example, manufacturing limitations may result in a bank A capacitor $C_A$ to equal $8.3*C_B$ (instead of $8*C_B$) and capacitors $C_{B1}+C_{B2}+C_{B3}+C_{B4}+C_{B5}+C_{B6}+C_{B7}$ together may equal $6.9*C_B$ (instead of $7*C_B$), resulting in a capacitance deviation of $C_{error} = 0.4*C_B$. Thus, transitioning from control word "00111" to "01000" would cause the output variable capacitance to transition from $6.9*C_B$ to $8.3*C_B$ instead of from $7*C_B$ to $8*C_B$. Such a significant deviation from the desired capacitance step change results in increased DCO output noise.

Noise caused by such transitions at capacitor bank sensitive boundaries may cause significant problems for PLLs employing DCO's using such variable capacitors. In particular, these problems become much more pronounced when the PLL settles at an output frequency near one of the capacitor bank sensitive boundaries. Settling at such a point may cause the capacitor banks to repeatedly and/or periodically enable and disable many capacitors across two or more capacitor banks as the control word controlling the DCO transitions back and forth between boundary-sensitive control words (e.g., 00111 and 01000). This may cause persistent noise injection problems and nonlinearities.

Thus, there exists a need to improve noise performance of DCOs utilizing variable capacitors comprising a plurality of capacitor banks. In particular, there exists a need to reduce noise injected by the variable capacitor at capacitor bank sensitive boundaries. Reducing such noise would improve the performance of the DCO and any circuits relying on the DCO, such as a PLL, for a linear, low-noise output frequency signal.

SUMMARY

One feature provides a digitally controlled oscillator (DCO) comprising a variable capacitor having a variable capacitance value that controls, in part, an output frequency of the DCO, the variable capacitance value based on a first bank capacitance value provided by a first capacitor bank, a second bank capacitance value provided by a second capacitor bank, and an auxiliary bank capacitance value provided by an auxiliary capacitor bank, and noise reduction circuitry coupled to the variable capacitor, the noise reduction circuitry adapted to adjust the variable capacitance value by adjusting the auxiliary bank capacitance value while maintaining at least one of the first bank capacitance value and/or the second bank capacitance value substantially unchanged. According to one aspect, the noise reduction circuitry is further adapted to receive an input DCO control word. According to another aspect, the noise reduction circuitry is further adapted to determine, prior to adjusting the variable capacitance value, that the received input DCO control word transitions across a capacitor bank sensitive boundary, the capacitor bank sensitive boundary marking a boundary between input DCO control words that without the noise reduction circuitry would necessitate disabling or enabling of at least one capacitor of the first capacitor bank and at least one capacitor of the second capacitor bank.

According to one aspect, the noise reduction circuitry is further adapted to determine, prior to adjusting the variable capacitance value, that the received input DCO control word has transitioned between two boundary-sensitive control words a predefined number of times. According to another aspect, the noise reduction circuitry is further adapted to determine, prior to adjusting the variable capacitance value, that the received input DCO control word has repeatedly transitioned between two boundary-sensitive control words for a predetermined amount of time. According to yet another aspect, the DCO further comprises an inductor and capacitor tank that includes the variable capacitor and a fixed capacitor.

According to one aspect, the noise reduction circuitry adjusts the variable capacitance value by providing an auxiliary capacitor enable signal to the auxiliary capacitor bank that couples or decouples at least one auxiliary capacitor of the auxiliary capacitor bank to an output of the DCO. According to another aspect, the noise reduction circuitry is further adapted to receive an input DCO control word that attempts to change at least one of the first bank capacitance value and/or the second bank capacitance value, generate a modified control word by subtracting a corresponding value associated with the auxiliary capacitor enable signal from the input DCO control word, and provide the modified control word to the first capacitor bank and the second capacitor bank to maintain the first bank capacitance value substantially unchanged.

According to one aspect, the first capacitor bank comprises a plurality of first capacitors, the second capacitor bank comprises a plurality of second capacitors, and the auxiliary capacitor bank comprises a plurality of auxiliary capacitors. According to another aspect, each of the second capacitors of the second capacitor bank have a capacitance value $C_B$, the first bank capacitor value is equal to $n*C_B$ where n is an integer greater than or equal to three (3), and each of the first capacitors of the first capacitor bank have a capacitance value $(n+1)*C_B$. According to yet another aspect, each of the auxiliary capacitors of the auxiliary capacitor bank have a capacitance value $C_Z$ that is equal to $(1/f)*C_B$, where f is equal to or greater than (1). According to another aspect, f is also a positive integer, and the auxiliary capacitor bank includes half the number of second capacitors comprising the second capacitor bank multiplied by f.

Another feature provides a method operational at a DCO that comprises controlling, in part, an output frequency of the DCO using a variable capacitor having a variable capacitance value based on a first bank capacitance value provided by a first capacitor bank, a second bank capacitance value provided by a second capacitor bank, and an auxiliary bank capacitance value provided by an auxiliary capacitor bank, and adjusting the variable capacitance value by adjusting the auxiliary bank capacitance value while maintaining at least one of the first bank capacitance value and the second bank capacitance value substantially unchanged. According to one aspect, the method further comprises receiving an input DCO control word. According to yet another aspect, the method further comprises determining, prior to adjusting the variable capacitance value, that the received input DCO control word transitions across a capacitor bank sensitive boundary, the capacitor bank sensitive boundary marking a boundary between input DCO control words that would otherwise necessitate disabling or enabling of at least one capacitor of the first capacitor bank and at least one capacitor of the second capacitor bank.

According to one aspect, the method further comprises determining, prior to adjusting the variable capacitance value, that the received input DCO control word has transitioned between two boundary-sensitive control words a predefined number of times. According to another aspect, the method further comprises determining, prior to adjusting the variable capacitance value, that the received input DCO control word has repeatedly transitioned between two boundary-sensitive control words for a predetermined amount of time. According to yet another aspect, the method further comprises adjusting the variable capacitance value by providing an auxiliary capacitor enable signal to the auxiliary capacitor bank that couples or decouples at least one auxiliary capacitor of the auxiliary capacitor bank to an output of the DCO.

According to one aspect, the method further comprises receiving an input DCO control word that attempts to change at least one of the first bank capacitance value and/or the second bank capacitance value, generating a modified control word by subtracting a corresponding value associated with the auxiliary capacitor enable signal from the input DCO control word, and providing the modified control word to the first capacitor bank and the second capacitor bank to maintain the first bank capacitance value substantially unchanged.

Another feature provides a DCO comprising a variable capacitor having a variable capacitance value that controls, in part, an output frequency of the DCO, the variable capacitance value based on a first bank capacitance value provided by a first capacitor bank, a second bank capacitance value provided by a second capacitor bank, and an auxiliary bank capacitance value provided by an auxiliary capacitor bank, and means for adjusting the variable capacitance value by adjusting the auxiliary bank capacitance value while maintaining at least one of the first bank capacitance value and the second bank capacitance value substantially unchanged. According to one aspect, the DCO further comprises means for receiving an input DCO control word. According to another aspect, the DCO further comprises means for determining, prior to adjusting the variable capacitance value, that the received input DCO control word transitions across a capacitor bank sensitive boundary, the capacitor bank sensitive boundary marking a boundary between input DCO control words that without the means for adjusting the variable capacitance value would necessitate disabling or enabling of at least one capacitor of the first capacitor bank and at least one capacitor of the second capacitor bank.

According to one aspect, the DCO further comprises means for determining, prior to adjusting the variable capacitance value, that the received input DCO control word has transitioned between two boundary-sensitive control words a predefined number of times. According to another aspect, the DCO further comprises means for determining, prior to adjusting the variable capacitance value, that the received input DCO control word has repeatedly transitioned between two boundary-sensitive control words for a predetermined amount of time. According to yet another aspect, the means for adjusting the variable capacitance value adjusts the variable capacitance value by providing an auxiliary capacitor enable signal to the auxiliary capacitor bank that couples or decouples at least one auxiliary capacitor of the auxiliary capacitor bank to an output of the DCO.

According to one aspect, the DCO further comprises means for receiving an input DCO control word that attempts to change at least one of the first bank capacitance value and/or the second bank capacitance value; means for generating a modified control word by subtracting a corresponding value associated with the auxiliary capacitor enable signal from the input DCO control word; and means for providing the modified control word to the first capacitor bank and the second capacitor bank to maintain the first bank capacitance value substantially unchanged.

Another feature provides a processor-readable storage medium having one or more instructions stored thereon that when executed by at least one processor causes the processor to control, in part, an output frequency of the DCO using a variable capacitor having a variable capacitance value based on a first bank capacitance value provided by a first capacitor bank, a second bank capacitance value provided by a second capacitor bank, and an auxiliary bank capacitance value provided by an auxiliary capacitor bank; and adjust the variable capacitance value by adjusting the auxiliary bank capacitance value while maintaining at least one of the first bank capacitance value and/or the second bank capacitance value substantially unchanged. According to one aspect, the instructions when executed by the processor further cause the processor to receive an input DCO control word. According to another aspect, the instructions when executed by the processor further cause the processor to determine, prior to adjusting the variable capacitance value, that the received input DCO control word transitions across a capacitor bank sensitive boundary, the capacitor bank sensitive boundary marking a boundary between input DCO control words that otherwise would necessitate disabling or enabling of at least one capacitor of the first capacitor bank and at least one capacitor of the second capacitor bank.

According to one aspect, the instructions when executed by the processor further cause the processor to adjust the variable capacitance value by providing an auxiliary capacitor enable signal to the auxiliary capacitor bank that couples or decouples at least one auxiliary capacitor of the auxiliary capacitor bank to an output of the DCO. According to another aspect the instructions when executed by the processor further cause the processor to receive an input DCO control word that attempts to change at least one of the first bank capacitance value and/or the second bank capacitance value, generate a modified control word by subtracting a corresponding value associated with the auxiliary capacitor enable signal from the input DCO control word, and provide the modified control word to the first capacitor bank and the second capacitor bank to maintain the first bank capacitance value substantially unchanged.

BRIEF DESCRIPTION OF THE DRAWINGS

FIG. 9 illustrates a partial table of control word signal values and their corresponding resultant capacitance values.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation.

Overview

One feature pertains to a digitally controlled oscillator (DCO) that comprises a variable capacitor and noise reduction circuitry. The variable capacitor has a variable capacitance value that controls an output frequency of the DCO. The variable capacitance value is based on a first bank capacitance value provided by a first capacitor bank, a second bank capacitance value provided by a second capacitor bank, and an auxiliary bank capacitance value provided by an auxiliary capacitor bank. The noise reduction circuitry is adapted to adjust the variable capacitance value by adjusting the auxiliary bank capacitance value while maintaining at least one of the first bank capacitance value and/or the second bank capacitance value substantially unchanged. Prior to adjusting the variable capacitance value, the noise reduction circuitry may determine that a received input DCO control word transitions across a capacitor bank sensitive boundary. The capacitor bank sensitive boundary marks a boundary between input DCO control words that—without the noise reduction circuitry—would necessitate disabling or enabling of at least one capacitor of the first capacitor bank and at least one capacitor of the second capacitor bank.

Exemplary PLL and DCO Featuring Noise Reduction Circuitry

Figure 2:
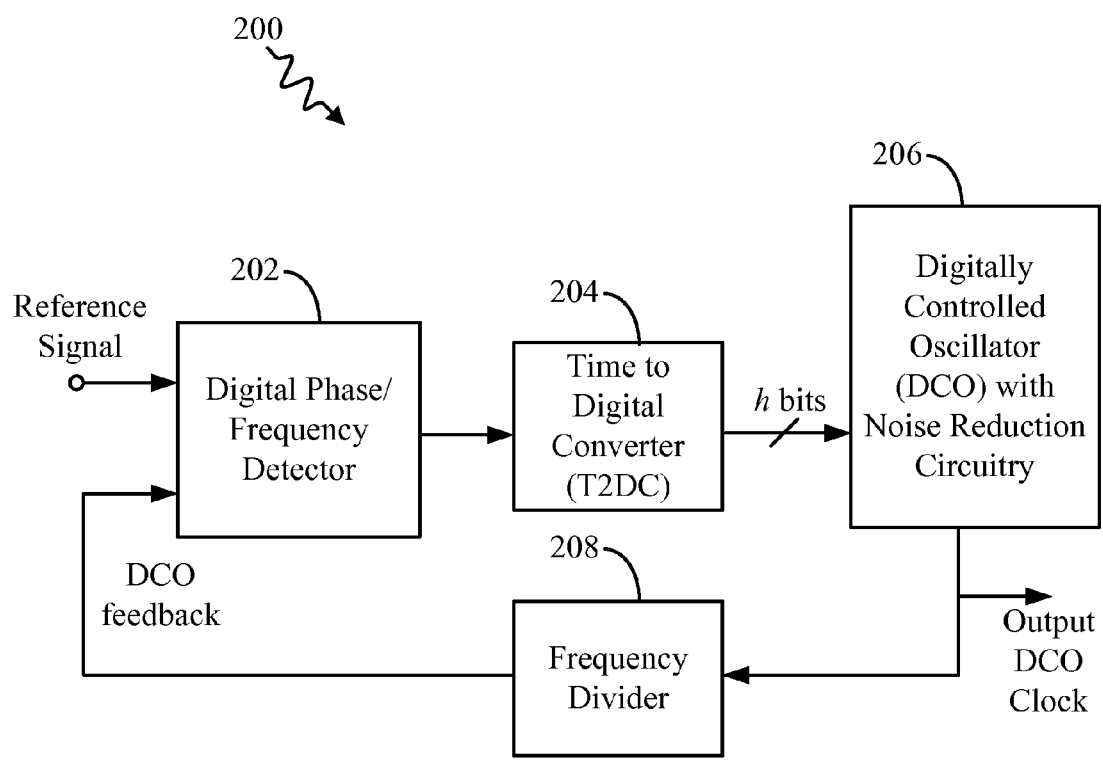
FIG. 2 illustrates a schematic block diagram of a phase locked loop (PLL) featuring a DCO having noise reduction circuitry.

FIG. 2 illustrates a schematic block diagram of a PLL 200 featuring a DCO having noise reduction circuitry according to one aspect of the disclosure. The PLL 200 includes a digital phase/frequency detector 202, a time to digital converter 204, a digitally controlled oscillator (DCO) having noise reduction circuitry 206, and a frequency divider 208. The digital phase/frequency detector 202 receives as its inputs a reference signal and the output of the frequency divider 208 (which is essentially a feedback signal of the DCO 206). The digital phase/frequency detector 202 determines whether the reference signal and the DCO feedback signal are in phase and operating at the same frequency and outputs this information to the time to digital converter 204. The time to digital converter 204 receives as its input information pertaining to the phase and frequency difference between the references signal and the DCO feedback signal and outputs a control word having h bits. The control word is received by the DCO 206 as an input, which instructs the DCO 206 to output a specific frequency depending on the control word inputted. The output of the DCO 206 may be used for clock distribution. As mentioned above, the output of the DCO 206 is also fed back to the digital phase/frequency detector 202 via the frequency divider 208 (albeit the frequency of the output fed back may be a fraction of the DCO 206 output frequency).

Figure 3:
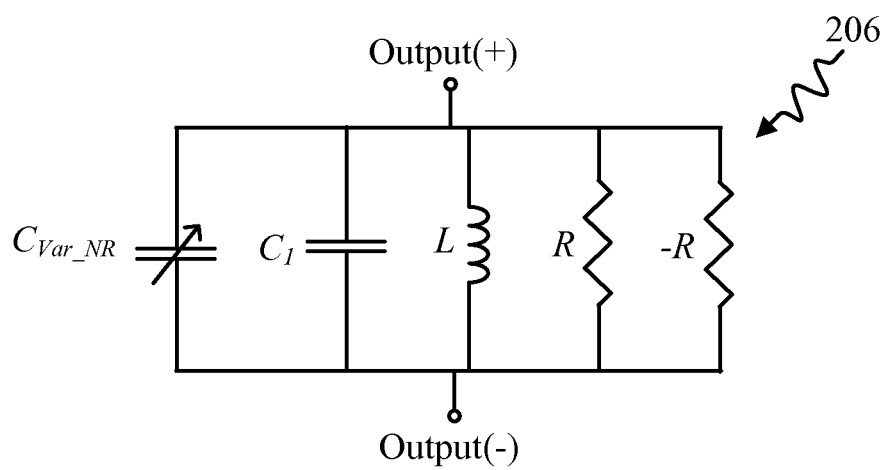
FIG. 3 illustrates a schematic block representation of a portion of a DCO.

FIG. 3 illustrates a simple schematic block representation of a portion of the DCO 206 according to one aspect. The DCO 206 is an LC-tank based DCO and may thus be generally represented as a fixed capacitor $C_1$, an inductor L, a resistor R, and a noise-reduced variable capacitor $C_{Var\_NR}$ connected in parallel. (As used herein, the term "$C_{Var\_NR}$" also refers to the capacitance value of the noise-reduced capacitor $C_{Var\_NR}$.) The DCO 206 also includes an amplifier whose gain (represented by the negative resistor −R) cancels out the losses due to the resistor R. The DCO 206 has a resonance frequency proportional to $1/(2*\pi*((C_{Var\_NR}+C_1))^{1/2}*L)$. Since the capacitor $C_1$ and the inductor L are fixed, the resonance frequency of the DCO 206 may be adjusted using the noise-reduced variable capacitor $C_{Var\_NR}$.

Figure 4:
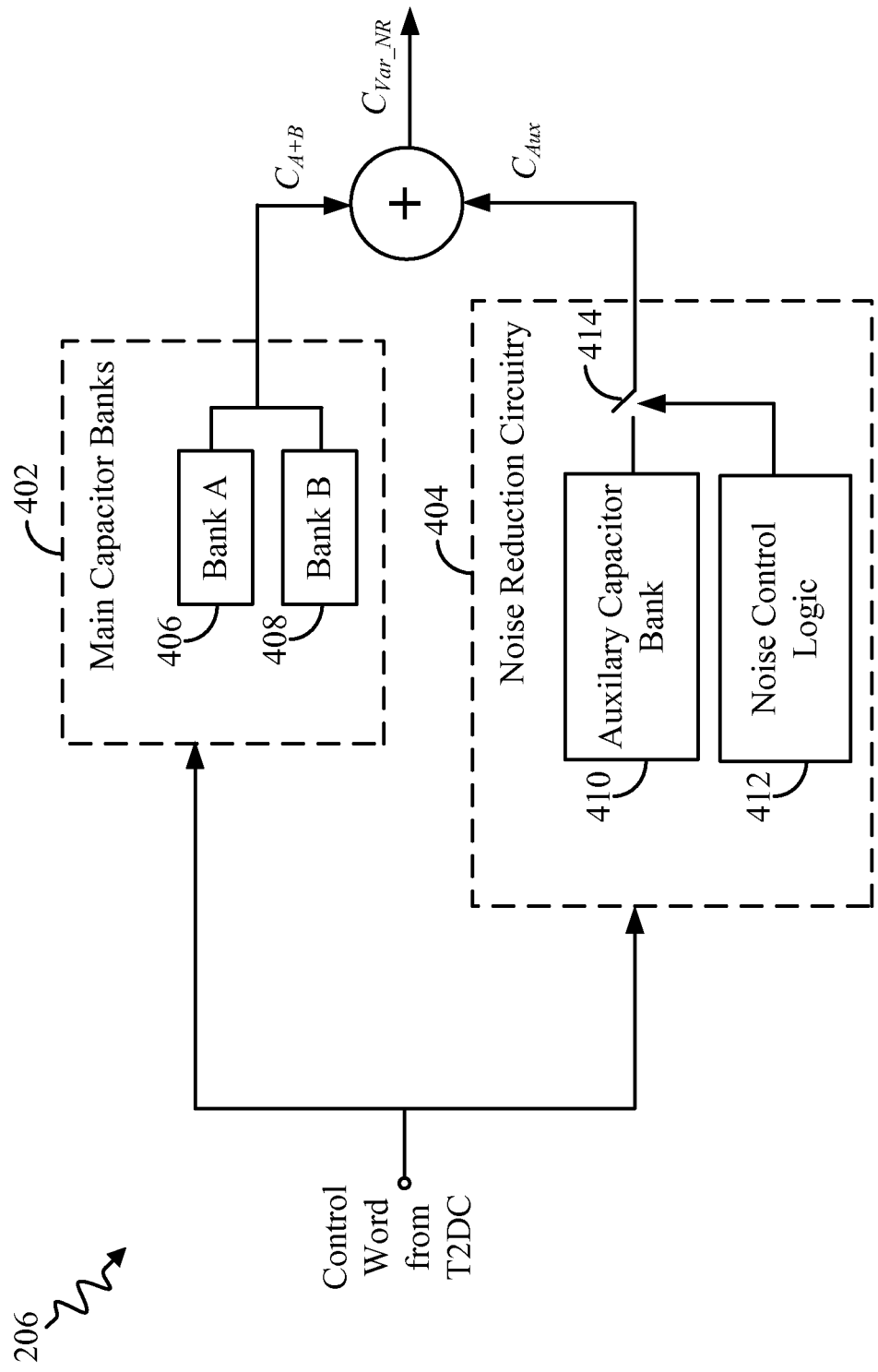
FIG. 4 illustrates a general schematic block diagram of a relevant portion of a DCO.

FIG. 4 illustrates a general schematic block diagram of a relevant portion of the DCO 206 according to one aspect. The DCO 206 comprises main capacitor bank circuitry 402 and noise reduction circuitry 404. The main capacitor bank circuitry 402 includes a plurality of main capacitor banks (e.g., bank A 406, bank B 408), and the noise reduction circuitry 404 includes an auxiliary capacitor bank 410 and noise control logic 412. The noise-reduced output variable capacitance value $C_{Var\_NR}$ is equal to the sum of the capacitances contributed but the various capacitor banks A, B, auxiliary. That is, $C_{Var\_NR}=C_{A+B}+C_{Aux}$. Any capacitance contribution to $C_{Var\_NR}$ by the auxiliary capacitance bank 410 may be controlled by the noise control logic 412, which connects/disconnects one or more capacitors of the auxiliary capacitance bank 410 from the total output capacitance $C_{Var\_NR}$ (e.g., one or more switches 414 may be controlled by the noise control logic 412.

As will be explained in greater detail below, the noise control logic 412 may connect one or more individual capacitors of the auxiliary capacitor bank 410 to the total output capacitance $C_{Var\_NR}$ in order to prevent undesirable capacitor switching (i.e., the enabling and/or disabling of capacitors) among different main capacitor banks (e.g., banks A and B 406, 408). For example, the noise control logic 412 may detect a control word transition between boundary-sensitive control words that would otherwise cause multiple capacitors in one bank (e.g., bank B 408) to become disabled and one or more capacitors in another bank (e.g., bank A 406) to become enabled. Instead of allowing multiple capacitors to become enabled and disabled across different capacitor banks—which injects a large amount of noise—the noise control logic 412 may enable one or more capacitors from the auxiliary capacitor bank 410 to increase or decrease the output variable capacitance $C_{Var\_NR}$ by an appropriate, incremental amount. Thus, the incremental capacitance needed by the control word transition (e.g., logical step up or step down) is provided by capacitor(s) associated with the auxiliary capacitor bank 410 rather than enabling and/or disabling capacitors of the main capacitor banks A and B 406, 408.

Figure 5:
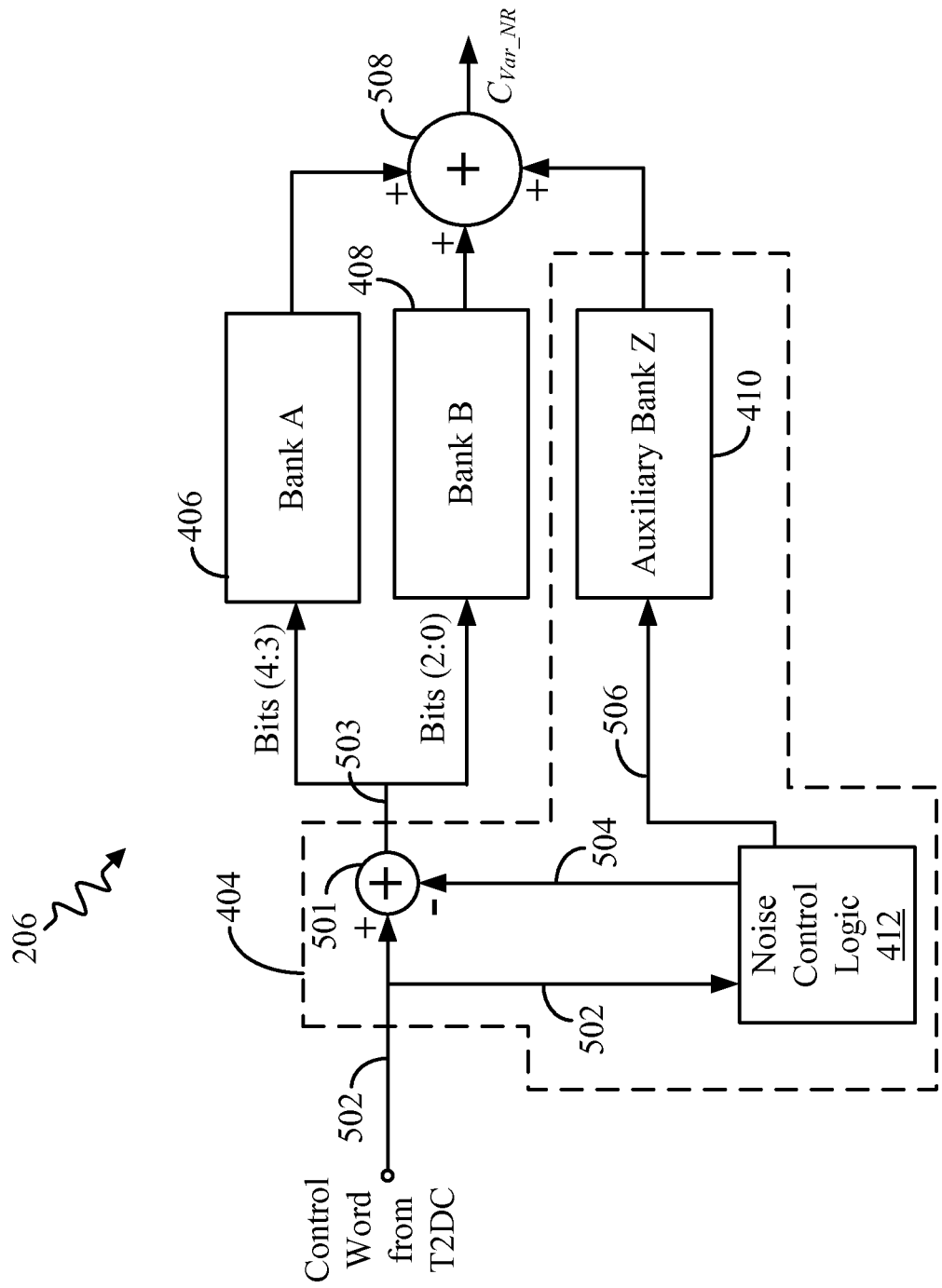
FIG. 5 illustrates a schematic block diagram of a relevant portion of a DCO featuring noise reduction circuitry.

FIG. 5 illustrates a schematic block diagram of a relevant portion of the DCO 206 featuring noise reduction circuitry 404 according to one aspect. The DCO 206 includes the first capacitor bank A 406, the second capacitor bank B 408, an auxiliary capacitor bank Z 410, and noise control logic 412. The auxiliary capacitor bank Z 410, the noise control logic 412, and a first adder 501 comprise the noise reduction circuitry 404. The noise control logic 412 receives a control word signal 502 received from the T2DC 204 (see FIG. 2). The noise control logic 412 provides a compensation signal 504 to the first adder 501 and an auxiliary capacitor enable signal 506 to the auxiliary capacitor bank Z 410. The capacitor banks A, B, and Z 406, 408, 410 added 508 together provide the capacitance value of the noise reduced variable capacitor $C_{Var\_NR}$, which is used to tune the DCO 206 frequency. The number of capacitor banks shown in FIG. 5 is merely exemplary. In other aspects, there may be more capacitors banks.

Figure 6:
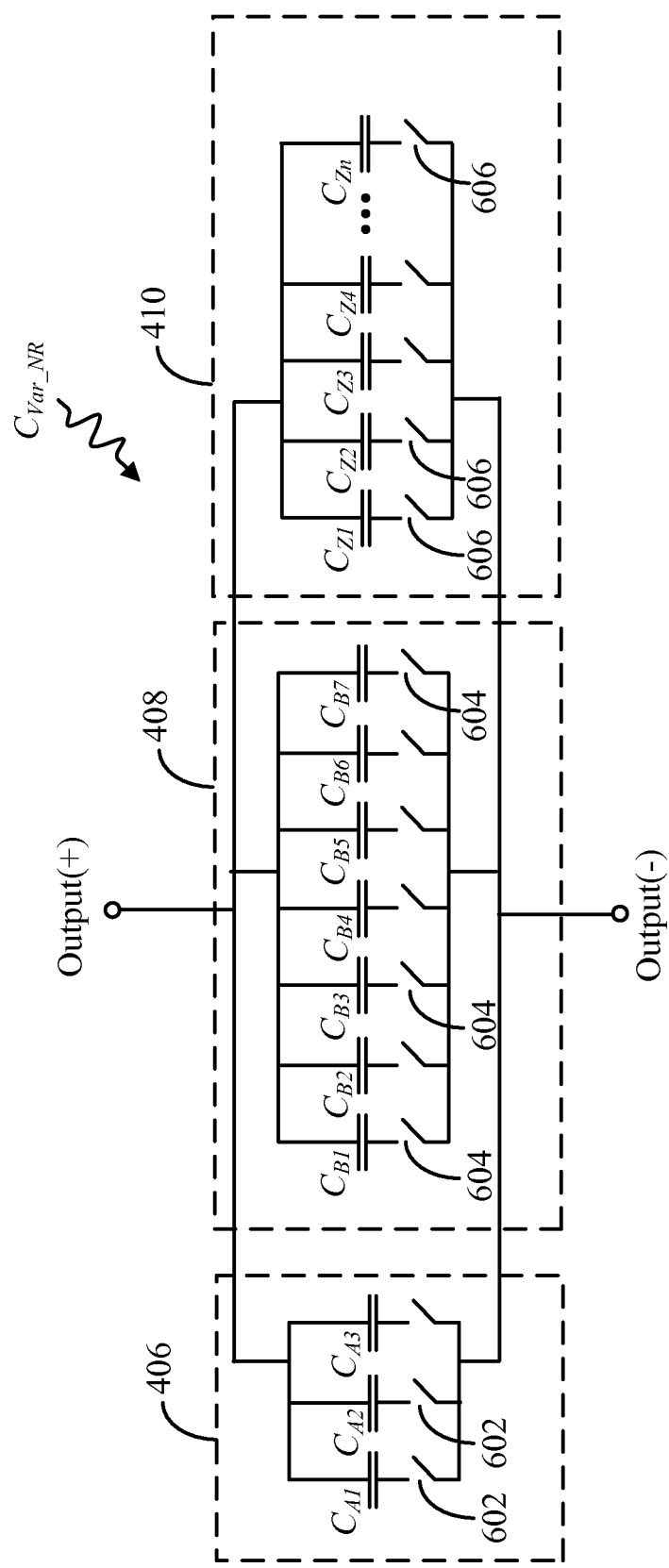
FIG. 6 illustrates capacitor banks A, B, and Z wired together in parallel.

FIG. 6 illustrates the capacitor banks A, B, and Z 406, 408, 410 wired together in parallel according to just one example. The sum of the capacitance contributed by each bank (i.e., banks A, B, and Z 406, 408, 410) provides the resulting variable capacitance value of $C_{Var\_NR}$. In this example, capacitor bank A 406 includes three (3) first capacitors $C_{A1}$, $C_{A2}$, $C_{A3}$ that all have equal capacitance values, and capacitor bank B 408 includes seven (7) second capacitors $C_{B1}$, $C_{B2}$, $C_{B3}$, $C_{B4}$, $C_{B5}$, $C_{B6}$, $C_{B7}$ that also all have equal capacitance values. The capacitance values of each of the capacitors of bank A 406 are equal to eight (8) times that of the capacitance values of the capacitors in bank B 408. Thus, $C_{Ax}=8*C_{By}$ (where x={1, 2, 3}; y={1, 2, 3, 4, 5, 6, 7}). In other aspects, capacitor banks A and B 406, 408 may have different numbers of capacitors and/or different values. Generally however the value of each bank A capacitor $C_A$ may equal $(n+1)*C_B$ where $C_B$ is the capacitance value of a bank B capacitor and n is the number of capacitors in bank B 408.

The auxiliary capacitor bank Z 410 may include one or more auxiliary capacitors each having a capacitance value $C_Z$ that is equal to or less than the capacitance value $C_B$ of a bank B capacitor. In the illustrated example, bank Z 410 has n auxiliary capacitors $C_{Z1}, C_{Z2}, C_{Z3}, C_{Z4}, \ldots C_{Zn}$ that each have a capacitance value $C_Z$ equal to a fraction (1/f) of the capacitance of a single bank B capacitor (i.e., $C_{Bx}=1/f*C_{Zy}$ (where x={1, 2, ... 7}; y={1, 2, ... n}; n is positive integer; and f is a value equal to or greater than one (1)). For the sake of clarity, many of the examples described herein will assume that bank Z 410 has 16 capacitors (i.e., n=16) that each have a capacitance value $C_Z$ equal to $\frac{1}{4}*C_B$ (i.e., f=4). Of course, auxiliary bank Z 410 may more or less capacitors than 16, and each capacitor may have a value $C_Z$ that is greater or less than $\frac{1}{4}*C_B$. For example, auxiliary bank Z may have 32 capacitors, each having a value $C_Z$ that is $\frac{1}{8}*C_B$. As another example, auxiliary bank Z may have 64 capacitors, each having a value $C_Z$ that is $\frac{1}{8}*C_B$ or $\frac{1}{16}*C_B$. According to one aspect, however, the value $C_Z$ of each bank Z 410 capacitor is less than the capacitance value of a single second capacitor bank capacitor (i.e., $C_Z \leq C_B$).

Each of the capacitor banks A, B, and Z 406, 408, 410 also include a plurality of switches 602, 604, 606 where each switch 602, 604, 606 is coupled to and associated with an individual capacitor $C_{A1}$, $C_{A2}$, $C_{A3}$, $C_{B1}$, $C_{B2}$, $C_{B3}$, $C_{B4}$, $C_{B5}$, $C_{B6}$, $C_{B7}$, $C_{Z1}$, $C_{Z2}$, $C_{Z3}$, $C_{Z4}$, ... $C_{Z16}$. (Note that for clarity not all the switches are labeled with reference numbers.) Enabling a switch 602, 604, 606 closes (i.e., short circuits) a circuit path that couples its associated capacitor to the output of the variable capacitor $C_{Var\_NR}$ (i.e., couples the capacitor between the output(+) and output(−) nodes).

Referring to FIGS. 5 and 6, the control word signal 502 minus the compensation signal 504 results in the modified control word signal 503. The latter signal 503 enables and disables bank A and B's switches 602, 604 so that the correct capacitors in each bank 406, 408 are coupled to the output variable capacitance $C_{Var\_NR}$. These capacitors provide at least a portion (in some cases all) of the desired overall capacitance value $C_{Var\_NR}$. In some cases, (as explained in greater detail below), auxiliary bank capacitors $C_{Z1}$, $C_{Z2}$, $C_{Z3}$, $C_{Z4}$, ... $C_{Z16}$ may also be coupled to provide additional capacitance to $C_{Var\_NR}$. Specifically, Bank Z's switches 606 that close the circuit paths and couple the capacitors $C_{Z1}$, $C_{Z2}$, $C_{Z3}$, $C_{Z4}$, ... $C_{Z16}$ are controlled by the auxiliary capacitor enable signal 506. The amount of capacitance provided to the variable capacitance value $C_{Var\_NR}$ by enabled capacitors of the first capacitor bank is referred to herein as the first bank capacitance value. The amount of capacitance provided to the variable capacitance value $C_{Var\_NR}$ by enabled capacitors of the second capacitor bank is referred to herein as the second bank capacitance value. The amount of capacitance provided to the variable capacitance value $C_{Var\_NR}$ by enabled capacitors of the auxiliary capacitor bank is referred to herein as the auxiliary bank capacitance value.

Figure 7:
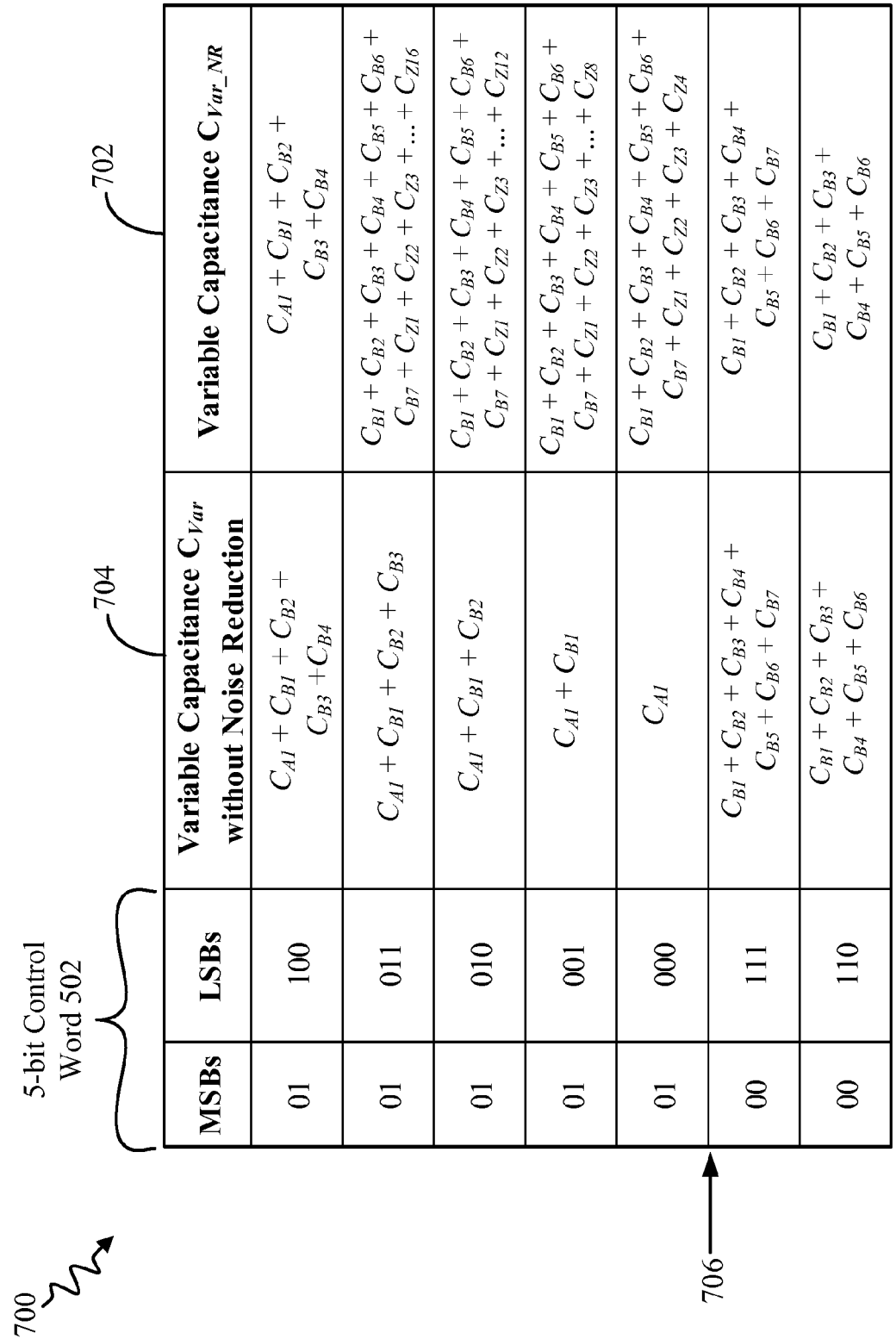
FIG. 7 illustrates a partial table of control word signal values and their corresponding resultant capacitance values.

FIG. 7 illustrates a partial table 700 of control word signal 502 values and their corresponding resultant capacitance values according to one example. Specifically, the table 700 includes a first column 702 that shows the noise reduced capacitance value $C_{Var\_NR}$ of the DCO 206 featuring noise reduction circuitry 404 alongside a second column 704 of what the ordinary capacitance value $C_{Var}$ would be using a DCO that does not have noise reduction circuitry 404. The table 700 also indicates the position of one capacitor bank sensitive boundary 706. The capacitor bank sensitive boundary 706 marks the logical boundary for the transition between control words that necessitates the disabling or enabling of a plurality of capacitors in one bank (e.g., bank B 408) and the enabling or disabling of one or more capacitors (e.g., larger capacitor) in another bank (e.g., bank A 406) to move one logical control word step up or down.

According to one example, for the non-boundary-sensitive control word "00110" the total output variable capacitance is comprised of the same capacitors (e.g., bank B capacitors $C_{B1}+C_{B2}+C_{B3}+C_{B4}+C_{B5}+C_{B6}$) for both the noise-reduced $C_{Var\_NR}$ case and the non-noise-reduced $C_{Var}$ case. Similarly, for the next logical control word "00111" the total output variable capacitance is comprised of the same capacitors (e.g., bank B capacitors $C_{B1}+C_{B2}+C_{B3}+C_{B4}+C_{B5}+C_{B6}+C_{B7}$) for both the noise-reduced $C_{Var\_NR}$ case and the non-noise-reduced $C_{Var}$ case. However, as the control word transitions across the capacitor bank sensitive boundary 706, the noise control logic (see FIGS. 4 and 5) 412 sends an auxiliary capacitor enable signal 506 to the auxiliary capacitor bank Z 410 and enables one or more capacitors (e.g., $C_{Z1}+C_{Z2}+C_{Z3}+C_{Z4}$) associated with auxiliary bank Z 410 to increase the total output variable capacitance $C_{Var\_NR}$ to the appropriate amount (e.g., total capacitance equal to $8*C_B$). This is performed instead of enabling a first capacitor bank A 406 capacitor (e.g., $C_{A1}$) and disabling seven (7) second capacitor bank B 408 capacitors (e.g., $C_{B1}+C_{B2}+C_{B3}+C_{B4}+C_{B5}+C_{B6}+C_{B7}$). Therefore, as shown in FIG. 7, $C_{Var\_NR}$ is equal to $C_{B1}+C_{B2}+C_{B3}+C_{B4}+C_{B5}+C_{B6}+C_{B7}+C_{Z1}+C_{Z2}+C_{Z3}+C_{Z4}$ for a total capacitance of $8*C_B$ (since in the example given $C_Z=\frac{1}{4}*C_B$). By contrast, a non-noise reduced DCO would instead simply cause its total output variable capacitance $C_{Var}$ to equal $C_{A1}$.

Thus, the example described above provides one instance where the total output variable capacitance value $C_{Var\_NR}$ is adjusted by adjusting the auxiliary bank capacitance value (e.g., auxiliary bank Z 410 capacitors are enabled) while maintaining the first bank capacitance value and the second bank capacitance value substantially unchanged (e.g., capacitors associated with the first capacitor bank A 406 and the second capacitor bank B 408 do not transition from enabled to disabled or from disabled to enabled). "Substantially unchanged" means that the enabled/disabled status of the capacitors associated with the first capacitor bank A 406 and the second capacitor bank B 408 (that respectively provide the first bank capacitance value and second bank capacitance value) remain unchanged but that due to environmental (e.g., temperature, voltage, etc.) variations the first bank capacitance value and the second bank capacitance value may fluctuate slightly (e.g., vary in time by 10%, 5%, 3%, 2%, 1%, and/or less than 1%).

Enabling and disabling a plurality of capacitors from different capacitor banks at the same time to transition between logical control words at capacitor bank sensitive boundaries injects noise into the output DCO signal due to the switching and also the capacitor mismatches between the different capacitor banks (e.g., bank A 406 and bank B 408). This noise is substantially reduced by instead adding capacitance from the auxiliary capacitor bank Z 410 to achieve the desired total output variable capacitance $C_{Var\_NR}$ for the given control word rather than disabling/enabling capacitors from banks A 406 and bank B 408.

With further reference to FIG. 7, according to one example, additional capacitors from the auxiliary capacitor bank Z 410 may be added as needed (until they are all enabled) to supply the additional capacitance needed for greater control words. For example, the total output variable capacitance $C_{Var\_NR}$ for the noise-reduced DCO 206 may be equal to $C_{B1}+C_{B2}+C_{B3}+C_{B4}+C_{B5}+C_{B6}+C_{B7}+C_{Z1}+C_{Z2}+C_{Z3}+ \ldots +C_{Z8}$ for control word "01001" instead of $C_{A1}+C_{B1}$ for the non-noise reduced DCO's capacitance $C_{Var}$. Similarly, the total output variable capacitance $C_{Var\_NR}$ for the noise-reduced DCO 206 may be equal to $C_{B1}+C_{B2}+C_{B3}+C_{B4}+C_{B5}+C_{B6}+C_{B7}+C_{Z1}+C_{Z2}+C_{Z3}+ \ldots +C_{Z16}$ for control word "01011" instead of $C_{A1}+C_{B1}+C_{B2}+C_{B3}$ for the non-noise reduced DCO's capacitance $C_{Var}$. Since the latter control word "01011" exhausts all available auxiliary capacitors of bank Z 410, the next control word "01100" may require the noise-reduced total output variable capacitance $C_{Var\_NR}$ to be $C_{A1}+C_{B1}+C_{B2}+C_{B3}+C_{B4}$.

In this fashion the auxiliary capacitor bank Z 410 provides additional/supplementary capacitance that may be added to the total variable capacitance $C_{Var\_NR}$ without having to enable/disable a plurality of capacitors across a plurality of different capacitor banks. Moreover, since the individual capacitors $C_{Z1}$, $C_{Z2}$, ... $C_{Zn}$ (where n is a positive integer) of the auxiliary capacitor bank may each have a capacitance value that is less than (e.g., a fraction of) the individual capacitors of the next smallest capacitor bank (e.g., bank B 408), the output DCO frequency can be fine-tuned to smaller discrete frequency steps. In the example illustrated in FIGS. 6 and 7, each auxiliary bank Z 410 capacitor has a capacitance equal to a fourth of the second capacitor bank B 408 capacitors, and thus bank Z 410 capacitors may be individually added or subtracted one at a time to reduce the output DCO 206 frequency by discrete steps that are four (4) times smaller than that which may be provided by adding or subtracting bank B capacitors.

Figure 8:
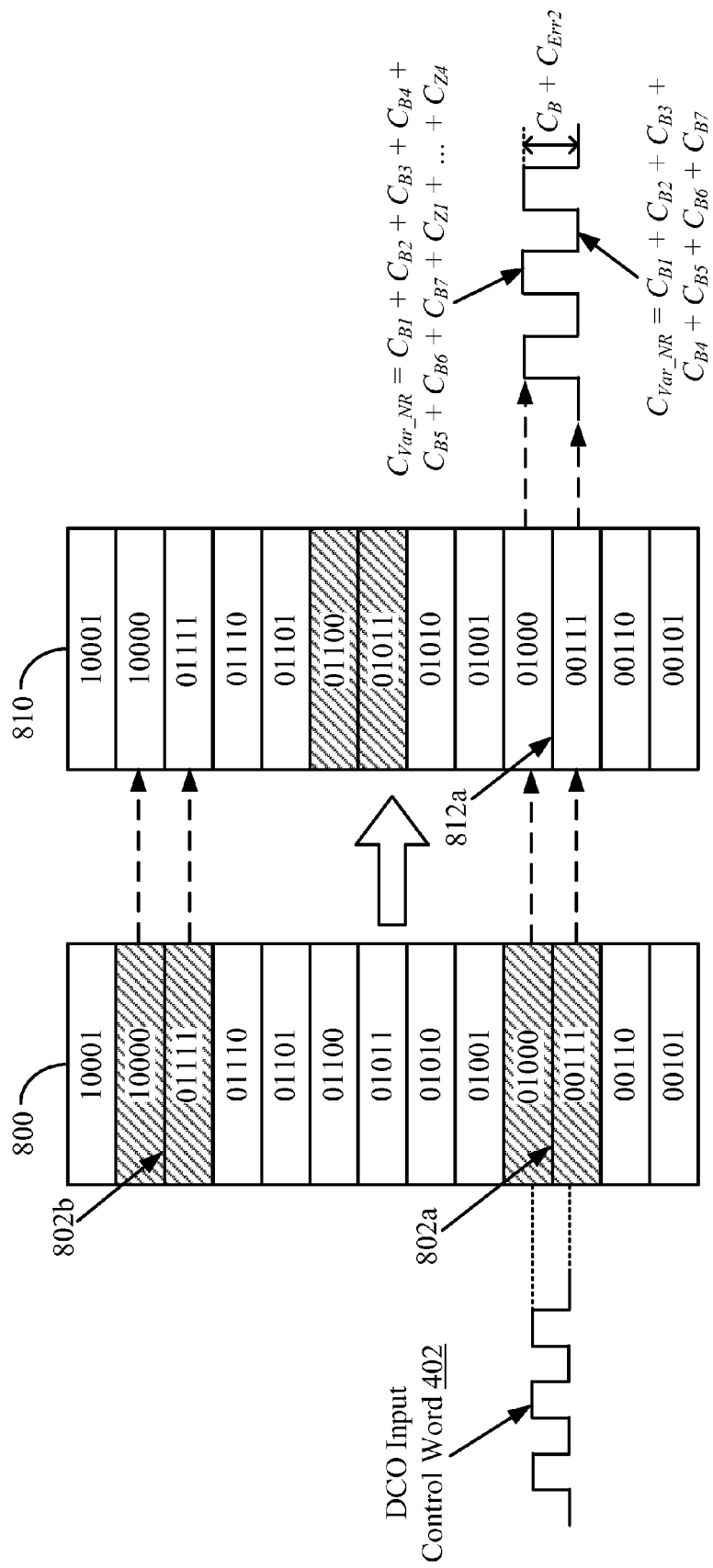
FIG. 8 illustrates a first example of tables that demonstrate how the noise reduction circuitry shifts control words previously associated with capacitor bank sensitive boundaries over to different logical control word values.

FIG. 8 illustrates tables 800 and 810 that demonstrate how the noise reduction circuitry 404 shifts control words previously associated with capacitor bank sensitive boundaries over to different logical control word values according to one aspect. The table 800 depicts a portion of the plurality of 5-bit control words that control the output frequency of the DCO 206 prior to any correction by the noise reduction circuitry 404. The table 800 shows that without noise correction circuitry 404, the DCO 206 has boundary-sensitive control words (shown with hatched background) "00111", "01000", "01111", and "10000" and capacitor bank sensitive boundaries 802a, 802b located between pairs of the aforementioned control words. More specifically, based on the example described above, since capacitor bank A 406 has four (4) capacitive step levels and capacitor bank B 408 has eight (8) capacitive step levels, the capacitor bank sensitive boundaries exists between: control words "00111" and "01000"; "01111" and "10000"; and "10111" and "11000." It is at these points where ordinarily all the bank B 408 capacitors are disabled/enabled (i.e., decoupled/coupled from the DCO output) and one large capacitor from bank A 406 is enabled/disabled (i.e., coupled/decoupled to the DCO output) when transitioning between (up or down) the capacitor bank sensitive boundaries.

Alternatively, the table 810 depicts the same portion of the plurality of 5-bit control words but with correction by the noise reduction circuitry 404. The table 810 shows that with noise correction circuitry 404 active, the DCO 206 no longer has boundary-sensitive control words at "00111", "01000", "01111", and "10000." Rather, in the example shown, the logical location of the boundary-sensitive control words has shifted over to "01011" and "01100."

In the illustrated example of FIG. 8, a DCO input control word signal is undergoing a small oscillation between the two boundary-sensitive control words "00111" and "01000." This may be the result of small changes in voltage and/or temperature of the PLL 200 circuit (see FIG. 2) after the PLL 200 has locked. Referring to FIGS. 5, 6, and 8, as a result of the small oscillation between boundary-sensitive control words, the noise reduction circuitry 404 (e.g., noise control logic 412) may detect such an oscillation (e.g., detect a transition across a capacitor bank sensitive boundary 802a) and provide (1) an auxiliary capacitor enable signal 506 to auxiliary capacitor bank Z 410 and (2) a compensation signal 504 to the first adder 501. As discussed above, such capacitor bank sensitive boundary transitions inject substantial noise, and when repeated periodically due to the settling of the PLL, introduce significant noise in the PLL. According to one aspect, the noise reduction circuitry 404 (e.g., noise control logic 412) may detect such a condition if the control word signal 502 transitions back and forth between two boundary-sensitive control words a predetermined number of times and/or for a predetermined period of time.

The auxiliary capacitor enable signal 506 causes one or more auxiliary bank Z 410 capacitors to become enabled (i.e., coupled to the output $C_{Var\_NR}$). In order to compensate for this additional capacitance added at the output $C_{Var\_NR}$, the compensation signal 504 logically subtracts a corresponding value from the control word 502 to send the modified control word 503 to the capacitor banks A and B 406, 408. The modified control word 503 then controls enabling or disabling of the individual capacitors of banks A and B 406, 408. The capacitances contributed by banks A and B 406, 408 based on the modified control word 503 and auxiliary bank Z 410 based on the auxiliary capacitor enable signal 506 results in the total output variable capacitance $C_{Var\_NR}$, which is governed by shifted mapping of table 810.

According to one example, the aforementioned auxiliary capacitor enable signal 506 causes capacitors $C_{Z1}$, $C_{Z2}$, $C_{Z3}$, and $C_{Z4}$ to be enabled and coupled in parallel to the output $C_{Var\_NR}$ (i.e., total capacitance of $C_B$ added if $C_Z=\frac{1}{4}*C_B$). To compensate, the compensation signal 504 logically subtracts a value equal to one LSB from the control word signal 502 thereby effectively causing the modified control word 503 to equal "00111" so that capacitors $C_{B1}+C_{B2}+C_{B3}+C_{B4}+C_{B5}+C_{B6}+C_{B7}$ remain enabled. Otherwise without the compensation signal, the control word signal 502 (e.g., "01000") fed directly to banks A and B 406, 408 would cause a bank A capacitor $C_{A1}$ to be enabled and seven (7) bank B capacitors $C_{B1}+C_{B2}+C_{B3}+C_{B4}+C_{B5}+C_{B6}+C_{B7}$ to be disabled from the output variable capacitance $C_{Var\_NR}$. In this fashion, for a given input control word, the noise-reduced total output variable capacitance $C_{Var\_NR}$ may substantially remain the same/unchanged (e.g., $8*C_B$) as the non-noise-reduced capacitance $C_{Var}$, but the specific capacitors (e.g., $C_{Z1}$, $C_{Z2}$, ... $C_{Z4}$) used to obtain the total capacitance value may be different and come from different capacitor banks (e.g., banks B and Z 408, 410 versus banks A and B 406, 408).

Figure 1:
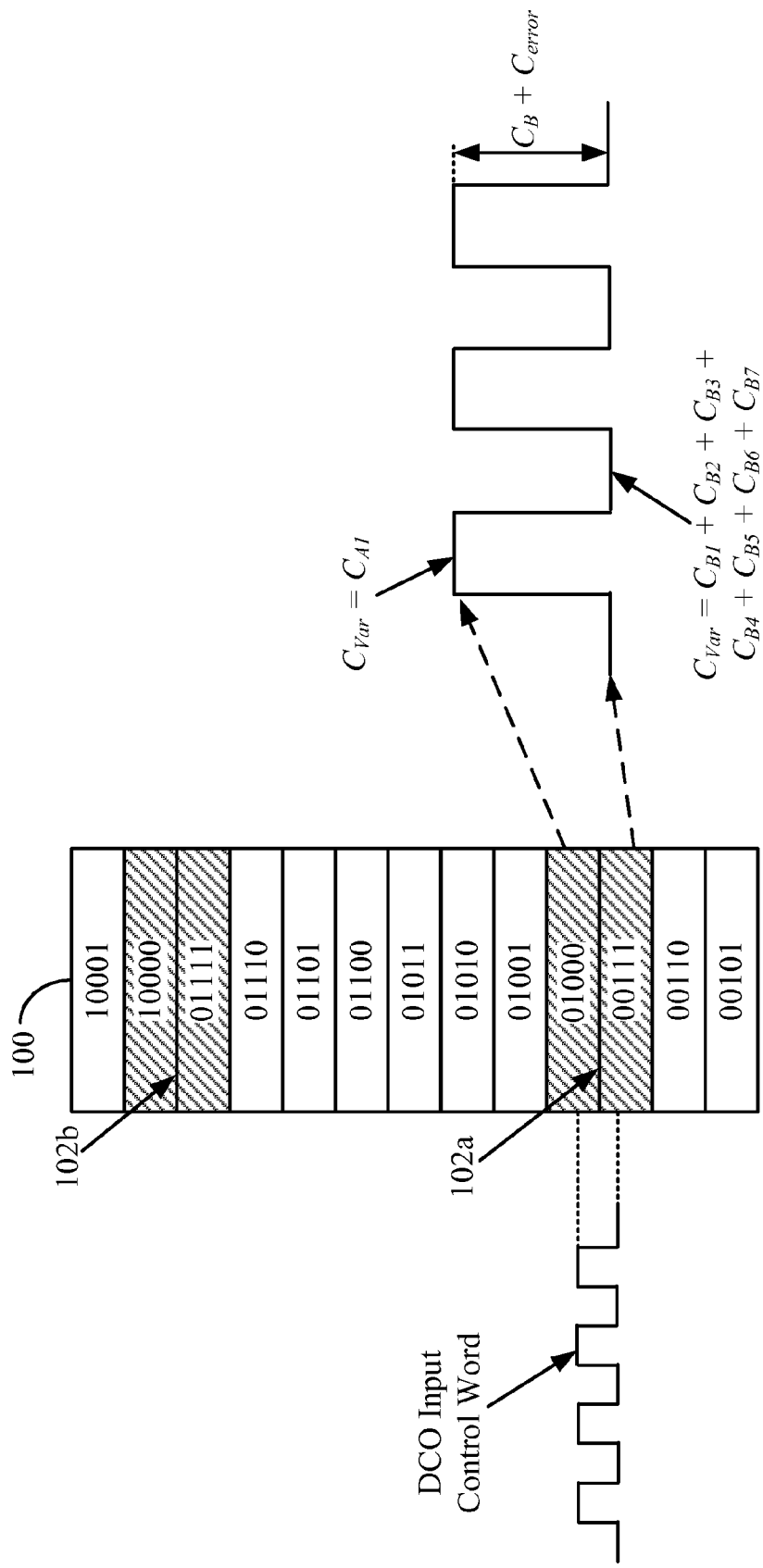
FIG. 1 illustrates an example of capacitor bank sensitive boundaries and control words and the effect they have on the total output variable capacitance $C_{Var}$ of a digitally controlled oscillator (DCO) found in the prior art.

Thus, the small DCO input control word oscillation ultimately causes the output variable capacitance $C_{Var\_NR}$ to oscillate back and forth between $C_{B1}+C_{B2}+C_{B3}+C_{B4}+C_{B5}+C_{B6}+C_{B7}$ and $C_{B1}+C_{B2}+C_{B3}+C_{B4}+C_{B5}+C_{B6}+C_{B7}+C_{Z1}+C_{Z2}+C_{Z3}+C_{Z4}$. Since only capacitors from the auxiliary bank Z 410 are added to satisfy the logical step transition from "00111" to "01000" instead of multiple capacitors from a plurality of different capacitor banks (e.g., banks A and B 406, 408), less noise is injected into the DCO output frequency signal. That is, the magnitude of the capacitive error $|C_{Err2}|$ associated with a deviation from the ideal output capacitance value of $8*C_B$ is less than the magnitude of the capacitive error $|C_{error}|$ of FIG. 1. This dramatically reduces the noise injected at the output of the DCO 206 even if the PLL 200 settles at a capacitor bank sensitive boundary value.

In this fashion, the noise reduction circuit 404 (e.g., noise control logic 412) centers (i.e., re-centers) the control word signal value(s) at which the PLL 200 has settled (e.g., "00111" and "01000") to be associated with a point in the field 810 where the auxiliary capacitor bank Z 410 provides or takes away capacitance as needed from the total variable capacitance $C_{Var\_NR}$ without having to enable/disable a plurality of capacitors across a plurality of different capacitor banks. In the example shown in FIG. 8, the settled DCO input control word value is now centered about a point 812a that corresponds where bank Z 410 capacitors will first begin being enabled.

FIG. 9 illustrates a partial table 900 of control word signal 502 values and their corresponding resultant capacitance values according to another example. Specifically, the table 900 includes a first column 902 that shows the noise reduced capacitance value $C_{Var\_NR}$ of the DCO 206 featuring noise reduction circuitry 404 alongside a second column 904 of what the ordinary capacitance value $C_{Var}$ would be using a DCO that does not have noise reduction circuitry 404. The table 900 also indicates the position of one capacitor bank sensitive boundary 906.

According to one example, for the non-boundary-sensitive control word "00101" the total output variable capacitance is comprised of the same capacitors (e.g., bank B capacitors $C_{B1}+C_{B2}+C_{B3}+C_{B4}+C_{B5}$) for both the noise-reduced $C_{Var\_NR}$ case and the non-noise-reduced $C_{Var}$ case. However, as the control word transitions across the capacitor bank sensitive boundary 906 (i.e., transitions from "00111" to "01000"), the noise control logic (see FIGS. 4 and 5) 412 sends an auxiliary capacitor enable signal 506 to the auxiliary capacitor bank Z 410 and enables a plurality of bank Z capacitors $C_{Z1}+C_{Z2}+C_{Z3}+\ldots+C_{Z12}$ to set the total output variable capacitance $C_{Var\_NR}$ to the appropriate amount (e.g., total capacitance equal to $8*C_B$ for control word "01000"). This is performed instead of enabling a first capacitor bank A 406 capacitor $C_{A1}$ and disabling all seven (7) second capacitor bank B 408 capacitors $C_{B1}+C_{B2}+C_{B3}+C_{B4}+C_{B5}+C_{B6}+C_{B7}$. (As described in greater detail below with reference to FIG. 10, some second capacitor bank B 408 capacitors (e.g., capacitors $C_{B6}$ and $C_{B7}$) may be disabled using a compensation signal 504). In one case, the noise control logic 412 may send the auxiliary capacitor enable signal 506 to the auxiliary capacitor bank Z 410 to enable the plurality of bank Z capacitors $C_{Z1}+C_{Z2}+C_{Z3}+\ldots+C_{Z12}$ after detecting a condition where the control word signal 502 transitions back and forth between boundary-sensitive control words "00111" and "01000" a predetermined number of times and/or for a predetermined period of time. Therefore, as shown in FIG. 9, $C_{Var\_NR}$ is equal to $C_{B1}+C_{B2}+C_{B3}+C_{B4}+C_{B5}+C_{Z1}+C_{Z2}+C_{Z3}+\ldots+C_{Z12}$ for a total capacitance of $8*C_B$ (since in the example given $C_Z=\frac{1}{4}*C_B$). By contrast, a non-noise reduced DCO would instead simply cause its total output variable capacitance $C_{Var}$ to equal $C_{A1}$.

Thus, the example described above provides one instance where the total output variable capacitance value $C_{Var\_NR}$ is adjusted by adjusting the auxiliary bank capacitance value (e.g., auxiliary bank Z 410 capacitors are enabled) while maintaining the first bank capacitance value substantially unchanged (e.g., capacitors associated with the first capacitor bank A 406 do not transition from enabled to disabled or from disabled to enabled). "Substantially unchanged" means that the enabled/disabled status of the capacitors associated with the first capacitor bank A 406 (that provides the first bank capacitance value) remain unchanged but that due to environmental (e.g., temperature, voltage, etc.) variations the first bank capacitance value may fluctuate slightly (e.g., vary in time by 10%, 5%, 3%, 2%, 1%, and/or less than 1%).

According to one example, additional capacitors from the auxiliary capacitor bank Z 410 may be added as needed (until they are all enabled) or disabled as needed (until they are all disabled) to supply or take away capacitance if the control word the PLL 200 is settled on changes (e.g., steps up or down). For example, the total output variable capacitance $C_{Var\_NR}$ for the noise-reduced DCO 206 may increase to $9*C_B$ by adding capacitors $C_{Z13}, C_{Z14}, C_{Z15}$, and $C_{Z16}$ if the control word transitions to "01001." By contrast, the non-noise reduced total variable capacitance $C_{Var}$ would instead equal $C_{A1}+C_{B1}$. Since the latter control word "01001" exhausts all available auxiliary capacitors of bank Z 410, the next control word "01010" may require that a bank A 406 capacitor be added so that the noise-reduced total output variable capacitance $C_{Var\_NR}$ becomes $C_{A1}+C_{B1}+C_{B2}$. As another example, if the control word transitions from "01000" back down to "00111", the total output variable capacitance $C_{Var\_NR}$ for the noise-reduced DCO 206 may decrease to $7*C_B$ by disabling capacitors $C_{Z9}, C_{Z10}, C_{Z11}$, and $C_{Z12}$. Thus, $C_{Var\_NR}$ may be given by $C_{B1}+C_{B2}+C_{B3}+C_{B4}+C_{B5}+C_{Z1}+C_{Z2}+C_{Z3}+\ldots+C_{Z8}$ as shown. By contrast, the non-noise reduced total variable capacitance $C_{Var}$ would instead equal $C_{B1}+C_{B2}+C_{B3}+C_{B4}+C_{B5}+C_{B6}+C_{B7}$.

Figure 10:
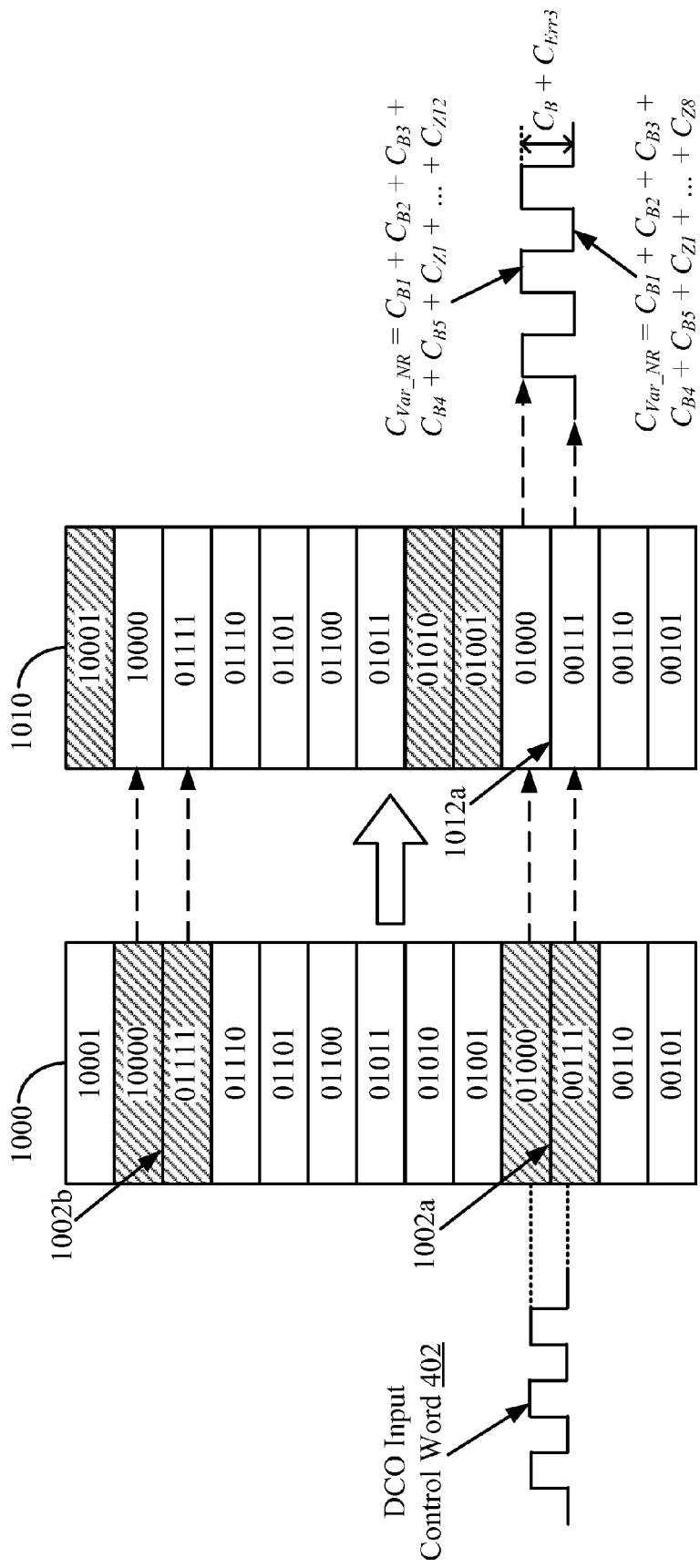
FIG. 10 illustrates a second example of tables that demonstrate how the noise reduction circuitry shifts control words previously associated with capacitor bank sensitive boundaries over to different logical control word values.

FIG. 10 illustrates tables 1000 and 1010 that demonstrate how the noise reduction circuitry 404 shifts control words previously associated with capacitor bank sensitive boundaries over to different logical control word values according to one aspect. The table 1000 depicts a portion of the plurality of 5-bit control words that control the output frequency of the DCO 206 prior to any correction by the noise reduction circuitry 404. The table 1000 shows that without noise correction circuitry 404, the DCO 206 has boundary-sensitive control words (shown with hatched background) "00111", "01000", "01111", and "10000" and capacitor bank sensitive boundaries 1002a, 1002b located between pairs of the aforementioned control words. More specifically, based on the example described above, since capacitor bank A 406 has four (4) capacitive step levels and capacitor bank B 408 has eight (8) capacitive step levels, the capacitor bank sensitive boundaries exists between: control words "00111" and "01000"; "01111" and "10000"; and "10111" and "11000." It is at these points where ordinarily all the bank B 408 capacitors are disabled/enabled (i.e., decoupled/coupled from the DCO output) and one large capacitor from bank A 406 is enabled/disabled (i.e., coupled/decoupled to the DCO output) when transitioning between (up or down) the capacitor bank sensitive boundaries.

Alternatively, the table 1010 depicts the same portion of the plurality of 5-bit control words but with correction by the noise reduction circuitry 404. The table 1010 shows that with noise correction circuitry 404 active, the DCO 206 no longer has boundary-sensitive control words at "00111", "01000", "01111", and "10000." Rather, in the example shown, the logical location of the boundary-sensitive control words has shifted over to "01001" and "01010."

In the illustrated example of FIG. 10, a DCO input control word signal is undergoing a small oscillation between the two boundary-sensitive control words "00111" and "01000." This may be the result of small changes in voltage and/or temperature of the PLL 200 circuit (see FIG. 2) after the PLL 200 has locked. Referring to FIGS. 5, 6, and 10, as a result of the small oscillation between boundary-sensitive control words, the noise reduction circuitry 404 (e.g., noise control logic 412) may detect such an oscillation (e.g., detect a transition across a capacitor bank sensitive boundary 1002a) and provide (1) an auxiliary capacitor enable signal 506 to auxiliary capacitor bank Z 410 and (2) a compensation signal 504 to the first adder 501. As discussed above, such capacitor bank sensitive boundary transitions inject substantial noise, and when repeated periodically due to the settling of the PLL, introduce significant noise in the PLL. According to one aspect, the noise reduction circuitry 404 (e.g., noise control logic 412) may detect such a condition if the control word signal 502 transitions back and forth between two boundary-sensitive control words a predetermined number of times and/or for a predetermined period of time.

The auxiliary capacitor enable signal 506 causes one or more auxiliary bank Z 410 capacitors to become enabled (i.e., coupled to the output $C_{Var\_NR}$). In order to compensate for this additional capacitance added at the output $C_{Var\_NR}$, the compensation signal 504 logically subtracts a corresponding value from the control word 502 to send the modified control word 503 to the capacitor banks A and B 406, 408. The capacitances contributed by banks A and B 406, 408 based on the modified control word 503 and auxiliary bank Z 410 based on the auxiliary capacitor enable signal 506 results in the total output variable capacitance $C_{Var\_NR}$, which is governed by shifted mapping of table 1010.

According to one example, the aforementioned auxiliary capacitor enable signal 506 causes capacitors $C_{Z1}$, $C_{Z2}$, $C_{Z3}$, ... $C_{Z12}$ to be enabled and coupled in parallel to the output $C_{Var\_NR}$ (i.e., total capacitance of $3*C_B$ added if $C_Z=\frac{1}{4}*C_B$). To compensate, the compensation signal 504 logically subtracts a value equal to three LSB from the control word signal 502 thereby effectively causing modified control word to equal "00101" so that capacitors $C_{B1}+C_{B2}+C_{B3}+C_{B4}+C_{B5}$ remain enabled. Otherwise without the compensation signal, the control word signal 502 (e.g., "01000") fed directly to banks A and B 406, 408 would cause a bank A capacitor $C_{A1}$ to be enabled and seven (7) bank B capacitors $C_{B1}+C_{B2}+C_{B3}+C_{B4}+C_{B5}+C_{B6}+C_{B7}$ to be disabled from the output variable capacitance $C_{Var\_NR}$. In this fashion, for a given input control word, the noise-reduced total output variable capacitance $C_{Var\_NR}$ may substantially remain the same/unchanged (e.g., $8*C_B$) as the non-noise-reduced capacitance $C_{Var}$, but the specific capacitors (e.g., $C_{Z1}$, $C_{Z2}$, ... $C_{Z12}$) used to obtain the total capacitance value may be different and come from different capacitor banks (e.g., banks B and Z 408, 410 versus banks A and B 406, 408).

Thus, the small DCO input control word oscillation between "00111" and "01000" ultimately causes the output variable capacitance $C_{Var\_NR}$ to oscillate back and forth between $C_{B1}+C_{B2}+C_{B3}+C_{B4}+C_{B5}+C_{Z1}+C_{Z2}+C_{Z3}+\ldots+C_{Z8}$ and $C_{B1}+C_{B2}+C_{B3}+C_{B4}+C_{B5}+C_{Z1}+C_{Z2}+C_{Z3}+\ldots+C_{Z12}$. Since only capacitors from the auxiliary bank Z 410 are added to satisfy the logical step transition from "00111" to "01000" instead of multiple capacitors from a plurality of different capacitor banks (e.g., banks A and B 406, 408), less noise is injected into the DCO output frequency signal. That is, the magnitude of the capacitive error $|C_{Err3}|$ associated with a deviation from the ideal output capacitance value of $8*C_B$ is less than the magnitude of the capacitive error $|C_{error}|$ FIG. 1. This dramatically reduces the noise injected at the output of the DCO 206 even if the PLL 200 settles at a capacitor bank sensitive boundary value.

In this fashion, the noise reduction circuit 404 (e.g., noise control logic 412) centers (i.e., re-centers) the control word signal value(s) at which the PLL 200 has settled (e.g., "00111" and "01000") to be associated with a point in the field 1010 where the auxiliary capacitor bank Z 410 provides or takes away capacitance as needed from the total variable capacitance $C_{Var\_NR}$ without having to enable/disable a plurality of capacitors across a plurality of different capacitor banks. In the example shown in FIG. 10, the settled DCO input control word value is now centered about a point 1012a that corresponds to at least half of the bank Z 410 capacitors being enabled.

Figure 11:
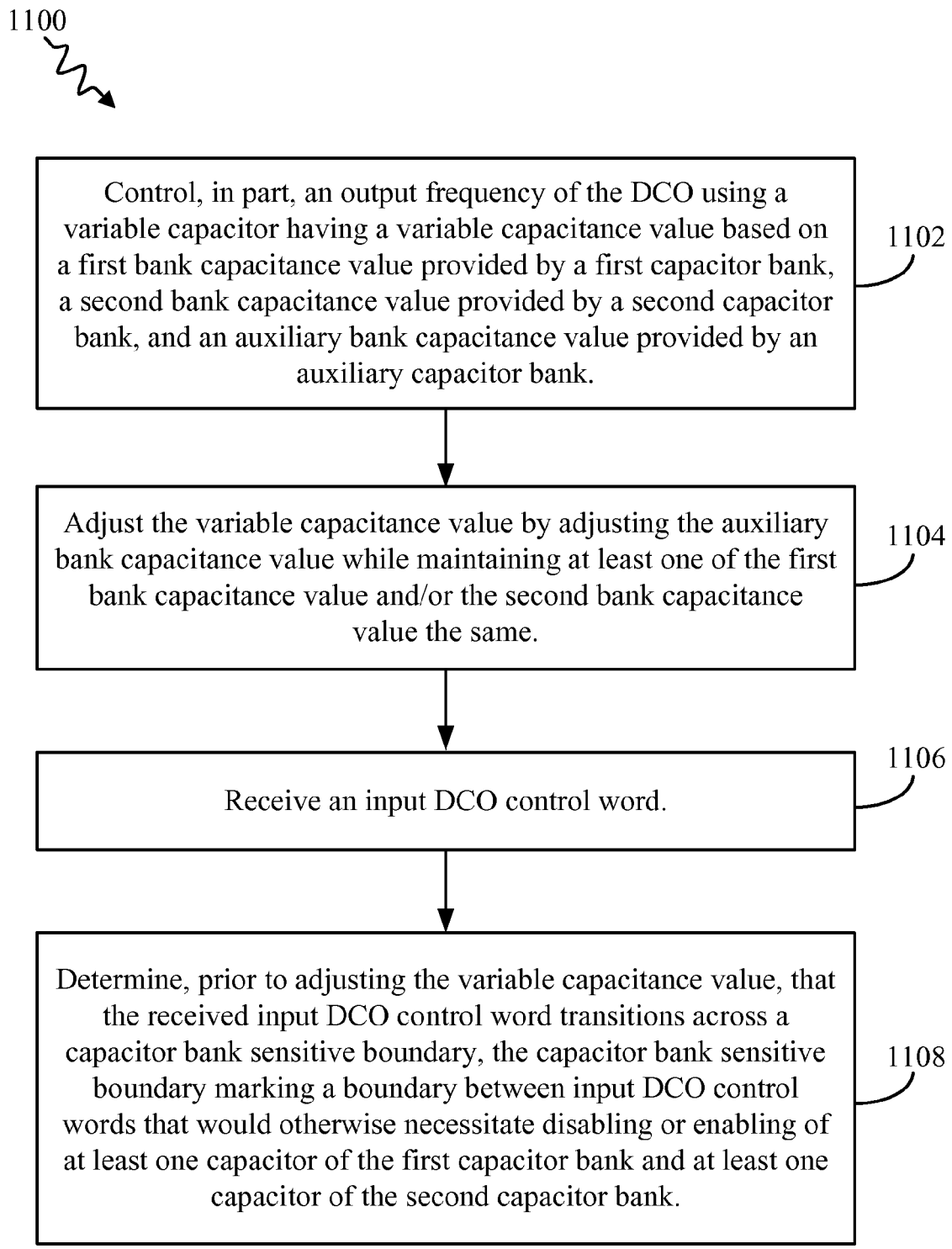
FIG. 11 illustrates a method operational at a DCO.

FIG. 11 illustrates a method 1100 operational at a DCO according to one aspect. First, an output frequency of the DCO is controlled, in part, using a variable capacitor having a variable capacitance value based on a first bank capacitance value provided by a first capacitor bank, a second bank capacitance value provided by a second capacitor bank, and an auxiliary bank capacitance value provided by an auxiliary capacitor bank 1102. Next, the variable capacitance value is adjusted by adjusting the auxiliary bank capacitance value while maintaining at least one of the first bank capacitance value and/or the second bank capacitance value substantially unchanged 1104. Then, an input DCO control word is received 1106. Then, prior to adjusting the variable capacitance value, it is determined that the received input DCO control word transitions across a capacitor bank sensitive boundary, where the capacitor bank sensitive boundary marks a boundary between input DCO control words that would otherwise necessitate disabling or enabling of at least one capacitor of the first capacitor bank and at least one capacitor of the second capacitor bank 1108.

Figure 12:
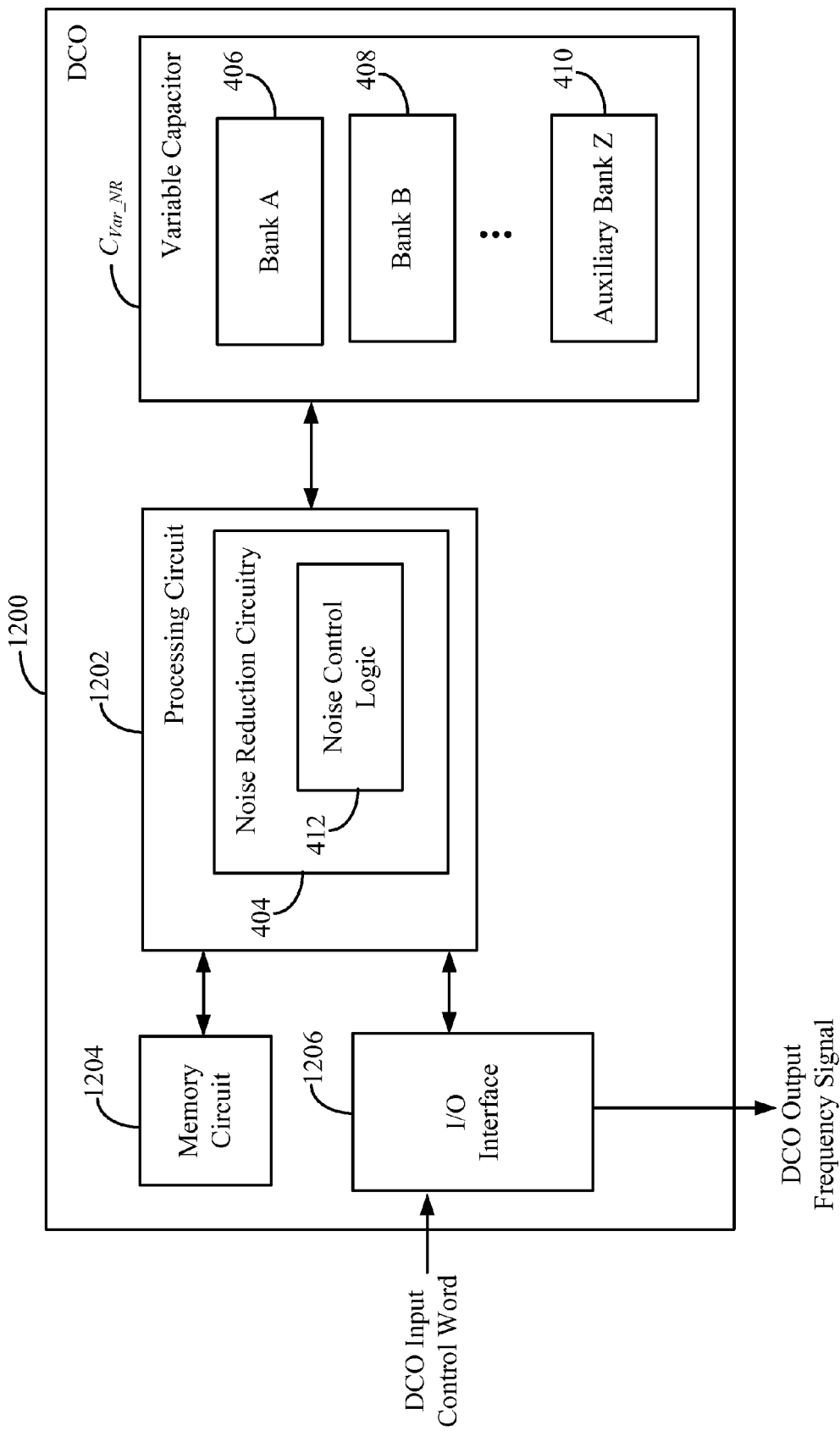
FIG. 12 illustrates a schematic block diagram of a DCO.

FIG. 12 illustrates a schematic block diagram of a DCO 1200 according to one aspect of the disclosure. The DCO 1200 may include any of the features and perform any of the operations of the DCO 206 shown in FIGS. 2-5 and described above. The DCO 1200 comprises a processing circuit 1202, a memory circuit 1204, an input/output (I/O) circuit 1206, and the variable capacitor $C_{Var\_NR}$.

The processing circuit 1202 may include, for example, the noise reduction circuitry 404 and the noise control logic 412 described above. The processing circuit 1202, the noise reduction circuitry 404, and/or the noise control logic 412 may be specialized circuits (e.g., application specific integrated circuits (ASICs)) that are specifically hard wired to perform any one of the method steps and/or operations described above with respect to the DCO 206. For example, the processing circuit 1202, the noise reduction circuitry 404, and/or the noise control logic 412 may all be examples of a: means for adjusting the variable capacitance value by adjusting the auxiliary bank capacitance value while maintaining at least one of the first bank capacitance value and/or the second bank capacitance value substantially unchanged; means for receiving an input DCO control word; means for determining, prior to adjusting the variable capacitance value, that the received input DCO control word transitions across a capacitor bank sensitive boundary; means for determining, prior to adjusting the variable capacitance value, that the received input DCO control word has transitioned between two boundary-sensitive control words a predefined number of times; means for determining, prior to adjusting the variable capacitance value, that the received input DCO control word has repeatedly transitioned between two boundary-sensitive control words for a predetermined amount of time; means for receiving an input DCO control word that attempts to change at least one of the first bank capacitance value and/or the second bank capacitance value; means for generating a modified control word by subtracting a corresponding value associated with the auxiliary capacitor enable signal from the input DCO control word; and means for providing the modified control word to the first capacitor bank and the second capacitor bank to maintain the first bank capacitance value substantially unchanged.

The memory circuit 1204 may be a processor-readable storage medium (e.g., non-volatile memory, etc.) that is adapted to store instruction that when executed by the processing circuit 1202 perform any of the operations described above with respect to the DCO 206, including but not limited to the steps shown and described with respect to the method 1100 of FIG. 11. The I/O memory circuit 1204 is communicatively coupled to the processing circuit 1202.

The I/O circuit 1206 is one example of a means for receiving an input DCO control word, and a means for providing a DCO output frequency signal. The I/O circuit 1206 is communicatively coupled to the processing circuit 1202. The variable capacitor $C_{Var\_NR}$ includes a plurality of capacitor banks, including bank A 406, bank B 408, and auxiliary bank Z 410. The variable capacitor $C_{Var\_NR}$ has a variable capacitance value that is based on a first bank capacitance value provided by the first capacitor bank 406, a second bank capacitance value provided by the second capacitor bank 408, and an auxiliary bank capacitance value provided by the auxiliary capacitor bank 410.

Figure 13:
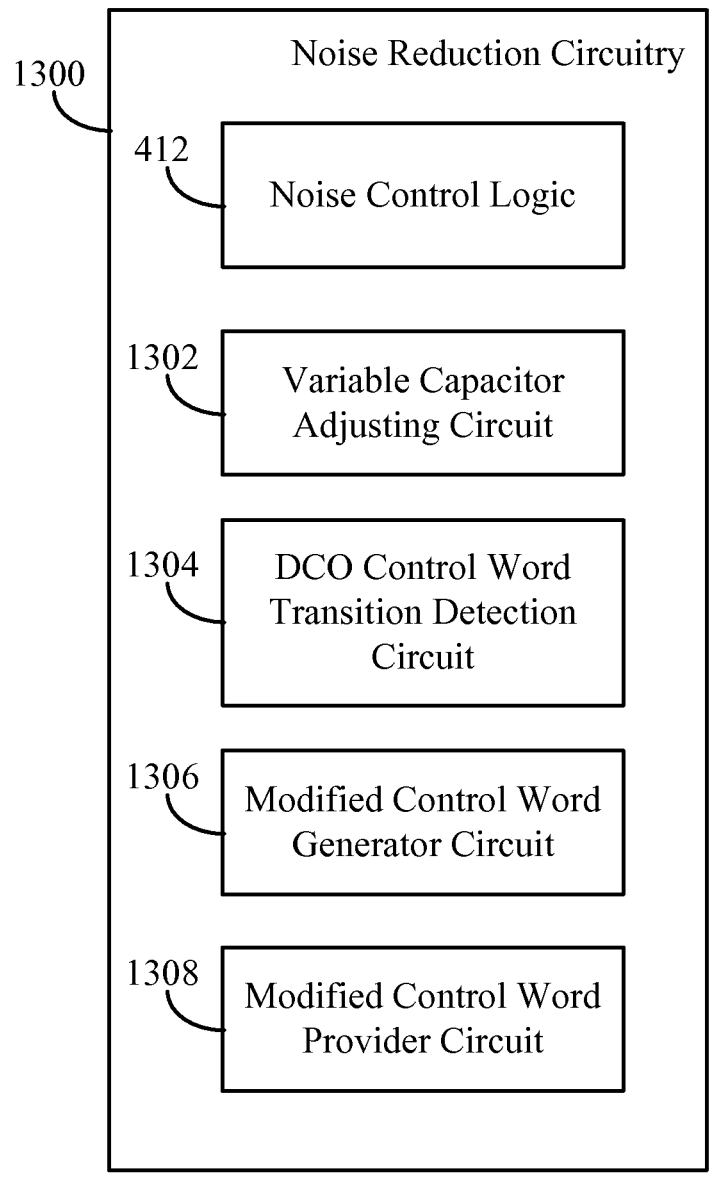
FIG. 13 illustrates a schematic block diagram of noise reduction circuitry.

FIG. 13 illustrates a schematic block diagram of noise reduction circuitry 1300 according to one aspect of the disclosure. The noise reduction circuitry 1300 may include any of the features and perform any of the operations of the noise reduction circuitry 404 shown in FIGS. 4 and 5, and described above. The noise reduction circuitry 1300 may include the noise control logic 412, variable capacitor adjusting circuit 1302, DCO control word transition detection circuit 1304, modified control word generator circuit 1306, and/or modified control word provider circuit 1308.

The variable capacitor adjusting circuit 1302 serves as one example of a means for adjusting the variable capacitance value by adjusting the auxiliary bank capacitance value while maintaining the first bank capacitance value and the second bank capacitance value substantially unchanged. The DCO control word transition detection circuit 1304 serves as one example of a means for determining, prior to adjusting the variable capacitance value, that the received input DCO control word transitions across a capacitor bank sensitive boundary. The DCO control word transition detection circuit 1304 also serves as one example of a means for determining, prior to adjusting the variable capacitance value, that the received input DCO control word has transitioned between two boundary-sensitive control words a predefined number of times. The DCO control word transition detection circuit 1304 also serves as one example of a means for determining, prior to adjusting the variable capacitance value, that the received input DCO control word has repeatedly transitioned between two boundary-sensitive control words for a predetermined amount of time.

The modified control word generator circuit 1306 serves as one example of a means for generating a modified control word by subtracting a corresponding value associated with the auxiliary capacitor enable signal from the input DCO control word. The modified control word provider circuit 1308 serves as one example of a means for providing the modified control word to the first capacitor bank and the second capacitor bank to maintain the first bank capacitance value and the second bank capacitance value substantially unchanged.

One or more of the components, steps, features, and/or functions illustrated in FIGS. 2, 3, 4, 5, 6, 7, 8, 9, 10, 11, 12 and/or 13 may be rearranged and/or combined into a single component, step, feature or function or embodied in several components, steps, or functions. Additional elements, components, steps, and/or functions may also be added without departing from the invention. The apparatus, devices, and/or components illustrated in FIGS. 2, 3, 4, 5, 6, 12, and/or 13 may be configured to perform one or more of the methods, features, or steps described in FIGS. 7, 8, 9, 10, and/or 11. The algorithms described herein may also be efficiently implemented in software and/or embedded in hardware.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine-readable mediums and, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing, containing or carrying instruction(s) and/or data. Thus, the various methods described herein may be fully or partially implemented by instructions and/or data that may be stored in a "machine-readable medium", "computer-readable medium", and/or "processor-readable medium" and executed by one or more processors, machines and/or devices.

Furthermore, aspects of the disclosure may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A digitally controlled oscillator (DCO), comprising:
a variable capacitor having a variable capacitance value that controls, in part, an output frequency of the DCO, the variable capacitance value based on a first bank capacitance value provided by a first capacitor bank, a second bank capacitance value provided by a second capacitor bank, and an auxiliary bank capacitance value provided by an auxiliary capacitor bank; and
noise reduction circuitry coupled to the variable capacitor, the noise reduction circuitry adapted to adjust the variable capacitance value by adjusting the auxiliary bank capacitance value while maintaining at least one of the first bank capacitance value and/or the second bank capacitance value substantially unchanged, wherein the noise reduction circuitry is further adapted to receive an input DCO control word and determine, prior to adjusting the variable capacitance value, that the received input DCO control word has transitioned between two boundary-sensitive control words at least one of a predetermined number of times or for a predetermined amount of time.

2. The DCO of claim 1, wherein the noise reduction circuitry is further adapted to:
determine, prior to adjusting the variable capacitance value, that the received input DCO control word transitions across a capacitor bank sensitive boundary, the capacitor bank sensitive boundary marking a boundary between input DCO control words that without the noise reduction circuitry would necessitate disabling or enabling of at least one capacitor of the first capacitor bank and at least one capacitor of the second capacitor bank.

3. The DCO of claim 1, wherein the noise reduction circuitry is further adapted to:
determine, prior to adjusting the variable capacitance value, that the received input DCO control word has repeatedly transitioned between two boundary-sensitive control words for the predetermined amount of time.

4. The DCO of claim 1, further comprising:
an inductor and capacitor tank that includes the variable capacitor and a fixed capacitor.

5. The DCO of claim 1, wherein the noise reduction circuitry adjusts the variable capacitance value by providing an auxiliary capacitor enable signal to the auxiliary capacitor bank that couples or decouples at least one auxiliary capacitor of the auxiliary capacitor bank to an output of the DCO.

6. The DCO of claim 5, wherein the noise reduction circuitry is further adapted to:
receive the input DCO control word that attempts to change at least one of the first bank capacitance value and/or the second bank capacitance value;
generate a modified control word by subtracting a corresponding value associated with the auxiliary capacitor enable signal from the input DCO control word; and
provide the modified control word to the first capacitor bank and the second capacitor bank to maintain the first bank capacitance value substantially unchanged.

7. The DCO of claim 1, wherein the first capacitor bank comprises a plurality of first capacitors, the second capacitor bank comprises a plurality of second capacitors, and the auxiliary capacitor bank comprises a plurality of auxiliary capacitors.

8. The DCO of claim 7, wherein each of the second capacitors of the second capacitor bank have a capacitance value $C_B$, the first bank capacitor value is equal to $n*C_B$ where n is an integer greater than or equal to three (3), and each of the first capacitors of the first capacitor bank have a capacitance value $(n+1)*C_B$.

9. The DCO of claim 8, wherein each of the auxiliary capacitors of the auxiliary capacitor bank have a capacitance value $C_z$ that is equal to $(1/f)*C_B$, where f is equal to or greater than (1).

10. The DCO of claim 9, wherein f is also a positive integer, and the auxiliary capacitor bank includes half the number of second capacitors comprising the second capacitor bank multiplied by f.

11. A method operational at a digitally controlled oscillator (DCO), the method comprising:
receiving an input DCO word;
controlling, in part, an output frequency of the DCO using a variable capacitor having a variable capacitance value based on a first bank capacitance value provided by a first capacitor bank, a second bank capacitance value provided by a second capacitor bank, and an auxiliary bank capacitance value provided by an auxiliary capacitor bank;
determining, prior to adjusting the variable capacitance value, that the received input DCO control word has transitioned between two boundary-sensitive control words at least one of a predetermined number of times or for a predetermined amount of time; and
adjusting the variable capacitance value by adjusting the auxiliary bank capacitance value while maintaining at least one of the first bank capacitance value and/or the second bank capacitance value substantially unchanged.

12. The method of claim 11, wherein the method further comprises:
determining, prior to adjusting the variable capacitance value, that the received input DCO control word transitions across a capacitor bank sensitive boundary, the capacitor bank sensitive boundary marking a boundary between input DCO control words that would otherwise necessitate disabling or enabling of at least one capacitor of the first capacitor bank and at least one capacitor of the second capacitor bank.

13. The method of claim 11, wherein the method further comprises:
determining, prior to adjusting the variable capacitance value, that the received input DCO control word has repeatedly transitioned between two boundary-sensitive control words for the predetermined amount of time.

14. The method of claim 11, wherein the method further comprises:
adjusting the variable capacitance value by providing an auxiliary capacitor enable signal to the auxiliary capacitor bank that couples or decouples at least one auxiliary capacitor of the auxiliary capacitor bank to an output of the DCO.

15. The method of claim 14, wherein the method further comprises:
receiving the input DCO control word that attempts to change at least one of the first bank capacitance value and/or the second bank capacitance value;
generating a modified control word by subtracting a corresponding value associated with the auxiliary capacitor enable signal from the input DCO control word; and
providing the modified control word to the first capacitor bank and the second capacitor bank to maintain the first bank capacitance value substantially unchanged.

16. A digitally controlled oscillator (DCO), comprising:
means for receiving an input DCO control word;
a variable capacitor having a variable capacitance value that controls, in part, an output frequency of the DCO, the variable capacitance value based on a first bank capacitance value provided by a first capacitor bank, a second bank capacitance value provided by a second capacitor bank, and an auxiliary bank capacitance value provided by an auxiliary capacitor bank;
means for determining, prior to adjusting the variable capacitance value, that the received input DCO control word has transitioned between two boundary-sensitive control words at least one of a predetermined number of times or for a predetermined amount of time; and
means for adjusting the variable capacitance value by adjusting the auxiliary bank capacitance value while maintaining at least one of the first bank capacitance value and/or the second bank capacitance value substantially unchanged.

17. The DCO of claim 16, wherein the means for determining comprises:
means for determining, prior to adjusting the variable capacitance value, that the received input DCO control word transitions across a capacitor bank sensitive boundary, the capacitor bank sensitive boundary marking a boundary between input DCO control words that without the means for adjusting the variable capacitance value would necessitate disabling or enabling of at least one capacitor of the first capacitor bank and at least one capacitor of the second capacitor bank.

18. The DCO of claim 16, further comprising wherein the means for determining comprises:
means for determining, prior to adjusting the variable capacitance value, that the received input DCO control word has repeatedly transitioned between two boundary-sensitive control words for the predetermined amount of time.

19. The DCO of claim 16, wherein the means for adjusting the variable capacitance value adjusts the variable capacitance value by providing an auxiliary capacitor enable signal to the auxiliary capacitor bank that couples or decouples at least one auxiliary capacitor of the auxiliary capacitor bank to an output of the DCO.

20. The DCO of claim 19, wherein the means for adjusting the variable capacitance comprises:
means for receiving the input DCO control word that attempts to change at least one of the first bank capacitance value and/or the second bank capacitance value;
means for generating a modified control word by subtracting a corresponding value associated with the auxiliary capacitor enable signal from the input DCO control word; and
means for providing the modified control word to the first capacitor bank and the second capacitor bank to maintain the first bank capacitance value substantially unchanged.

21. A non-transitory processor-readable storage medium having one or more instructions stored thereon that when executed by at least one processor causes the processor to:
receive an input DCO control word;
control, in part, an output frequency of the DCO using a variable capacitor having a variable capacitance value based on a first bank capacitance value provided by a first capacitor bank, a second bank capacitance value provided by a second capacitor bank, and an auxiliary bank capacitance value provided by an auxiliary capacitor bank;
determine, prior to adjusting the variable capacitance value, that the received input DCO control word has transitioned between two boundary-sensitive control words at least one of a predetermined number of times or for a predetermined amount of time; and
adjust the variable capacitance value by adjusting the auxiliary bank capacitance value while maintaining at least one of the first bank capacitance value and/or the second bank capacitance value substantially unchanged.

22. The non-transitory processor-readable storage medium of claim 21, wherein the instructions when executed by the processor further cause the processor to:
determine, prior to adjusting the variable capacitance value, that the received input DCO control word transitions across a capacitor bank sensitive boundary, the capacitor bank sensitive boundary marking a boundary between input DCO control words that otherwise would necessitate disabling or enabling of at least one capacitor of the first capacitor bank and at least one capacitor of the second capacitor bank.

23. The non-transitory processor-readable storage medium of claim 21, wherein the instructions when executed by the processor further cause the processor to:
adjust the variable capacitance value by providing an auxiliary capacitor enable signal to the auxiliary capacitor bank that couples or decouples at least one auxiliary capacitor of the auxiliary capacitor bank to an output of the DCO.

24. The non-transitory processor-readable storage medium of claim 23, wherein the instructions when executed by the processor further cause the processor to:
receive the input DCO control word that attempts to change at least one of the first bank capacitance value and/or the second bank capacitance value;
generate a modified control word by subtracting a corresponding value associated with the auxiliary capacitor enable signal from the input DCO control word; and provide the modified control word to the first capacitor bank and the second capacitor bank to maintain the first bank capacitance value substantially unchanged.

* * * * *